US010726909B1

(12) United States Patent
Dhani Reddy et al.

(10) Patent No.: US 10,726,909 B1
(45) Date of Patent: Jul. 28, 2020

(54) MULTI-PORT MEMORY ARRAYS WITH INTEGRATED WORLDWIDE COUPLING MITIGATION STRUCTURES AND METHOD

(71) Applicant: MARVELL INTERNATIONAL LTD., Hamilton (BM)

(72) Inventors: Sreenivasula Reddy Dhani Reddy, Bangalore (IN); Vinay Bhat Soori, Karnataka (IN); Md Nadeem Iqbal, Bihar (IN)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 16/359,076

(22) Filed: Mar. 20, 2019

(51) Int. Cl.
| G11C 11/00 | (2006.01) |
| G11C 11/418 | (2006.01) |
| G11C 8/16 | (2006.01) |
| G11C 11/417 | (2006.01) |
| G11C 11/419 | (2006.01) |

(52) U.S. Cl.
CPC .............. *G11C 11/418* (2013.01); *G11C 8/16* (2013.01); *G11C 11/417* (2013.01); *G11C 11/419* (2013.01)

(58) Field of Classification Search
CPC . G11C 16/0483; G11C 11/16; G11C 11/1655; G11C 11/1657; G11C 11/1659; G11C 11/1673; G11C 11/1675; G11C 11/1693; G11C 11/4091; G11C 11/4094; G11C 11/419
USPC .... 365/185.18, 185.02, 185.17, 158, 185.05, 365/185.23, 185.28, 189.11
See application file for complete search history.

(56) References Cited

U.S. PATENT DOCUMENTS

| 5,119,334 A | 6/1992 | Fujii |
| 5,708,621 A | 1/1998 | Tanoi |
| 6,176,990 B1 | 1/2001 | Yager et al. |
| 7,502,273 B2 | 3/2009 | Liaw |
| 8,432,756 B1 | 4/2013 | Sullivan et al. |
| 8,437,214 B2 | 5/2013 | Mikan et al. |
| 8,675,427 B2 | 3/2014 | Behrends et al. |
| 9,099,172 B2 | 8/2015 | Liaw |

(Continued)

OTHER PUBLICATIONS

Kuilkarni et al., "Capacitive-Coupling Wordline Boosting with Self-Induced VCCcollapse for Write VMINreduction in 22-nm 8T SRAM," IEEE International Solid-State Circuits Conference, 2012, pp. 234-236.

*Primary Examiner* — Thong Q Le

(57) ABSTRACT

Disclosed is a multi-port memory array configured to minimize resistance-capacitance (RC) delay caused by wordline coupling. In each row of the array, a first voltage boost circuit is connected to the distal ends of a first wordline and a second wordline and boosts a first voltage on the first wordline during an access period when the first voltage is transitioning from low to high and when, concurrently, a second voltage on the second wordline is either low or transitioning to low. Optionally, a second voltage boost circuit is also connected to the distal ends of the first and second wordlines and boosts the second voltage on the second wordline during a different access period when the second voltage is transitioning from low to high and when, concurrently, the first voltage on the first wordline is either at low or transitioning from high to low. Also disclosed is a corresponding method.

23 Claims, 12 Drawing Sheets

(56) References Cited

U.S. PATENT DOCUMENTS

2007/0279966 A1* 12/2007 Houston ............... G11C 11/412
                                                      365/154

* cited by examiner

US 10,726,909 B1

MULTI-PORT MEMORY ARRAYS WITH INTEGRATED WORLDWIDE COUPLING MITIGATION STRUCTURES AND METHOD

BACKGROUND

Field of the Invention

The present invention relates to multi-port memory arrays and, more particularly, to mitigation of wordline coupling effects in multi-port memory arrays, such as two-port or dual-port memory arrays.

Description of Related Art

Conventional, single-port (SP) memory arrays, such as single-port static random access memory (SRAM) arrays, allow a single access of a memory cell (e.g., either a read or a write operation) to occur at each clock cycle (i.e., access period). Multi-port (MP) memory arrays allow two accesses of the same memory cell or to different memory cells in the same row or different rows during the same clock cycle (i.e., the same access period). For example, a two-port (2P) SRAM array allows both a read operation and a write operation to occur during the same clock cycle. A dual-port (DP) SRAM array allows two read operations, two write operations, or both a read operation and a write operation to occur during the same clock cycle. Thus, multi-port memory arrays have essentially twice the bandwidth of single-port memory arrays. However, due to the more complex wiring schemes required to enable such multi-port configurations and also due to the decrease in memory cell size and increase wire density with each new technology node, resistive-capacitive (RC) delay caused by coupling of adjacent wordlines has resulted in an increase in write and read fails.

SUMMARY

In view of the foregoing, disclosed herein is a multi-port memory array (e.g., a two port-static random access memory (2P-SRAM) array or a dual port-static random access memory (DP-SRAM) array) that incorporates voltage boost circuits for automatically boosting the voltage on wordlines to minimize resistance-capacitance (RC) delay caused by coupling between adjacent wordlines when certain conditions are met. The disclosed embodiments of the multi-port memory array can include multi-port memory cells arranged in columns and rows. Each row can have two different wordlines (i.e., a first wordline and a second wordline) and all of the memory cells in a given row can be connected to the two different wordlines for that row, thereby enabling access to the same memory cell or to different memory cells in the same row or different rows through two different ports (i.e., a first port referred to herein as port A and a second port referred to herein as port B).

The disclosed embodiments of the multi-port memory array can further include a first voltage boost circuit for each row and, optionally, a second voltage boost circuit for each row. Specifically, in each row, the two different wordlines (i.e., the first wordline and the second wordline) can be connected to a first voltage boost circuit. The first voltage boost circuit can be configured to boost a first voltage on the first wordline during an access period when the first voltage is transitioning from a low voltage level toward a high voltage level for memory cell access through the first port (i.e., port A) and when, concurrently, a second voltage on the second wordline is either at the low voltage level or transitioning from the high voltage level to the low voltage level.

Optionally, in each row, the two different wordlines (i.e., the first wordline and the second wordline) can also be connected to a second voltage boost circuit. This second voltage boost circuit can be configured to boost the second voltage on the second wordline during a different access period when the second voltage is transitioning from the low voltage level toward the high voltage level for memory cell access through the second port (i.e., port B) and when, concurrently, the first voltage on the first wordline is either at the low voltage level or transitioning from the high voltage level to the low voltage level.

It should be noted that the negative impact of wordline coupling (i.e., resistance-capacitance (RC) delay caused by wordline coupling) is negligible at the proximal ends of the wordlines near the wordline drivers and worsens as the distance from the wordline drivers increases (i.e., at the distal ends). Thus, the above-described voltage boost circuits are connected to the wordlines at or near the distal ends farthest from those wordline drivers that are employed to activate the wordlines. Additionally, the timing of the above-described voltage boost circuits can be controlled using signals that are internally generated within the multi-port memory array such that the disclosed embodiments provide an integrated self-assist wordline coupling mitigation solution.

Also disclosed herein is a method of operating a multi-port memory array (e.g., a two port-static random access memory (2P-SRAM) array or a dual port-static random access memory (DP-SRAM) array). The method embodiments employ voltage boost circuits to automatically boost the voltage on wordlines to minimize resistance-capacitance (RC) delay caused by coupling between adjacent wordlines when certain conditions are met. The method embodiments can include providing a multi-port memory array, which includes multi-port memory cells arranged in columns and rows. The method embodiments can further include accessing memory cells within the multi-port memory array through two different ports. During this process, a first wordline connected to each of the memory cells in a given row can be activated to enable access to the memory cells in that row through a first port (e.g., port A) and, during the same clock cycle, a second wordline connected to each of the memory cells in the same row can be activated to enable access to the memory cells through a second port (i.e., port B). For example, for a given row, the first wordline can be activated to access a selected memory cell in the row and, during the same clock cycle, the second wordline can be activated to access either the same selected memory cell in the row or a different selected memory cell in the row.

The method embodiments can further include boosting a first voltage on the first wordline for a given row during an access period when the first voltage is transitioning from a low voltage level toward a high voltage level for memory cell access and when, concurrently, a second voltage on the second wordline is either at the low voltage level or transitioning from the high voltage level to the voltage level. Boosting the first voltage can be performed automatically by a first voltage boost circuit, which is connected to both the first wordline and the second wordline.

Optionally, the method embodiments can also include, for the given row, boosting a second voltage on the second wordline during a different access period when the second voltage is transitioning from the low voltage level toward the high voltage level to enable memory cell access and when, concurrently, the first voltage on the first wordline is either at the low voltage level or transitioning from the high voltage level to the voltage level. Boosting the second voltage can be performed automatically by a second voltage boost circuit, which is also connected to both the first wordline and the second wordline.

It should be noted that the negative impact of wordline coupling (i.e., resistance-capacitance (RC) delay caused by wordline coupling) is negligible at the proximal ends of the wordlines near the wordline drivers and worsens as the distance from the wordline drivers increases (i.e., near the distal ends). Thus, in the method embodiments, the above-described voltage boosting processes can be performed at or near the distal ends of the wordlines farthest from the wordline drivers. Additionally, the method embodiments can include controlling the timing of the above-described voltage boosting processes using signals that are internally generated within the multi-port memory array such that the method provides an integrated self-assist wordline coupling mitigation solution.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

As mentioned above, conventional, single-port (SP) memory arrays, such as single-port static random access memory (SRAM) arrays, allow a single access of a memory cell (e.g., either a read or a write operation) to occur at each clock cycle. Multi-port (MP) memory arrays, such as two-port (2P) SRAM arrays or dual-port (DP) SRAM arrays, allow two accesses of either the same memory cell or different memory cells in the same row or in different rows to occur during the same clock cycle (i.e., during the same access period).

Specifically, 2P-SRAM arrays allow a port A write operation and a port B read operation of the same selected memory cell or a different memory cell in the same row or different rows to occur during the same clock cycle.

Figure 1A:
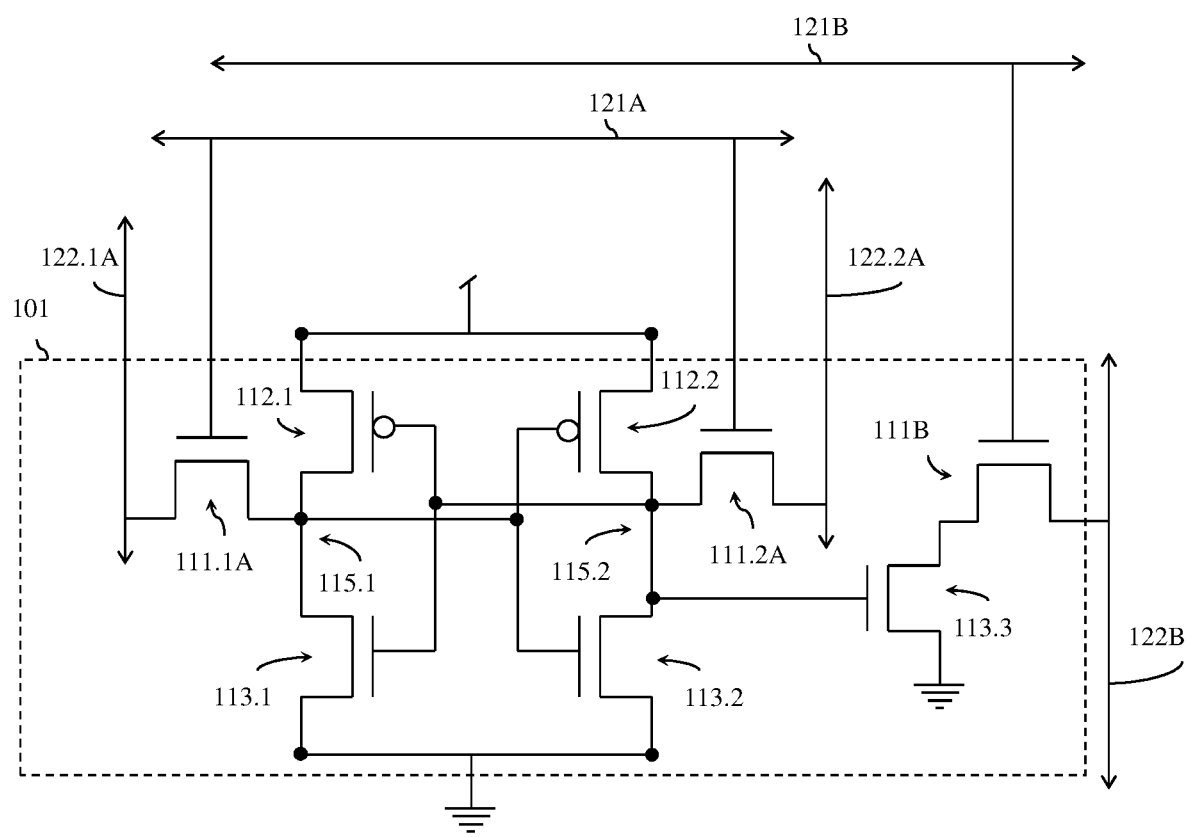
FIGS. 1A and 1B are schematic diagrams illustrating a two-port static random access memory (2P-SRAM) cell and a 2P-SRAM array, respectively.

FIG. 1A is a schematic diagram illustrating an exemplary 2P-SRAM cell 101. This 2P-SRAM cell 101 is an eight-transistor (8T) SRAM cell, which is connected to a complementary pair of bitlines 122.1A and 122.2A and a first wordline 121A (referred to as a write wordline) for write port A and which is also connected to an additional bitline 122B (referred to as a read bitline) and a second wordline 121B (referred to as a read wordline) for the read port B. Specifically, the 2P-SRAM cell 101 includes a pair of cross-coupled inverters. The cross-coupled inverters include a first inverter and a second inverter. The first inverter is connected between a positive voltage rail and a ground rail and includes a first pull-up transistor 112.1 connected in series to a first pull-down transistor 113.1. The second inverter is also connected between the positive voltage rail and the ground rail and includes a second pull-up transistor 112.2 connected in series to a second pull-down transistor 113.2. In these cross-coupled inverters, the voltage level on a first storage node 115.1 at the interface between the first pull-up transistor 112.1 and the first pull-down transistor 113.1 controls the gates of the second pull-up transistor 112.2 and the second pull-down transistor 113.2 and the voltage level on a second storage node 115.2 at the interface between the second pull-up transistor 112.2 and the second pull-down transistor 113.2 controls the gates of the first pull-up transistor 112.1 and the first pull-down transistor 113.1.

For the write port A, a pair of pass-gate transistors selectively connect the pair of complementary bitlines to the storage nodes. That is, a first pass-gate transistor 111.1A selectively connects a first bitline 122.1A to the first storage node 115.1 and a second pass-gate transistor 111.2A selectively connects a second bitline 122.2A to the second storage node 115.2. The gates of the first pass-gate transistor 111.1A and the second pass-gate transistor 111.2A are controlled by the voltage level on the same write wordline 121A.

For the read port B, an additional pass-gate transistor 111B and an additional pull-down transistor 113.1 are connected in series between the read bitline 122B and ground. Furthermore, the gate of the additional pass-gate transistor 111B is controlled by the voltage level on the read wordline 121B and the gate of the additional pull-down transistor 113.3 is controlled by the voltage level on the second storage node 115.2.

Figure 1B:
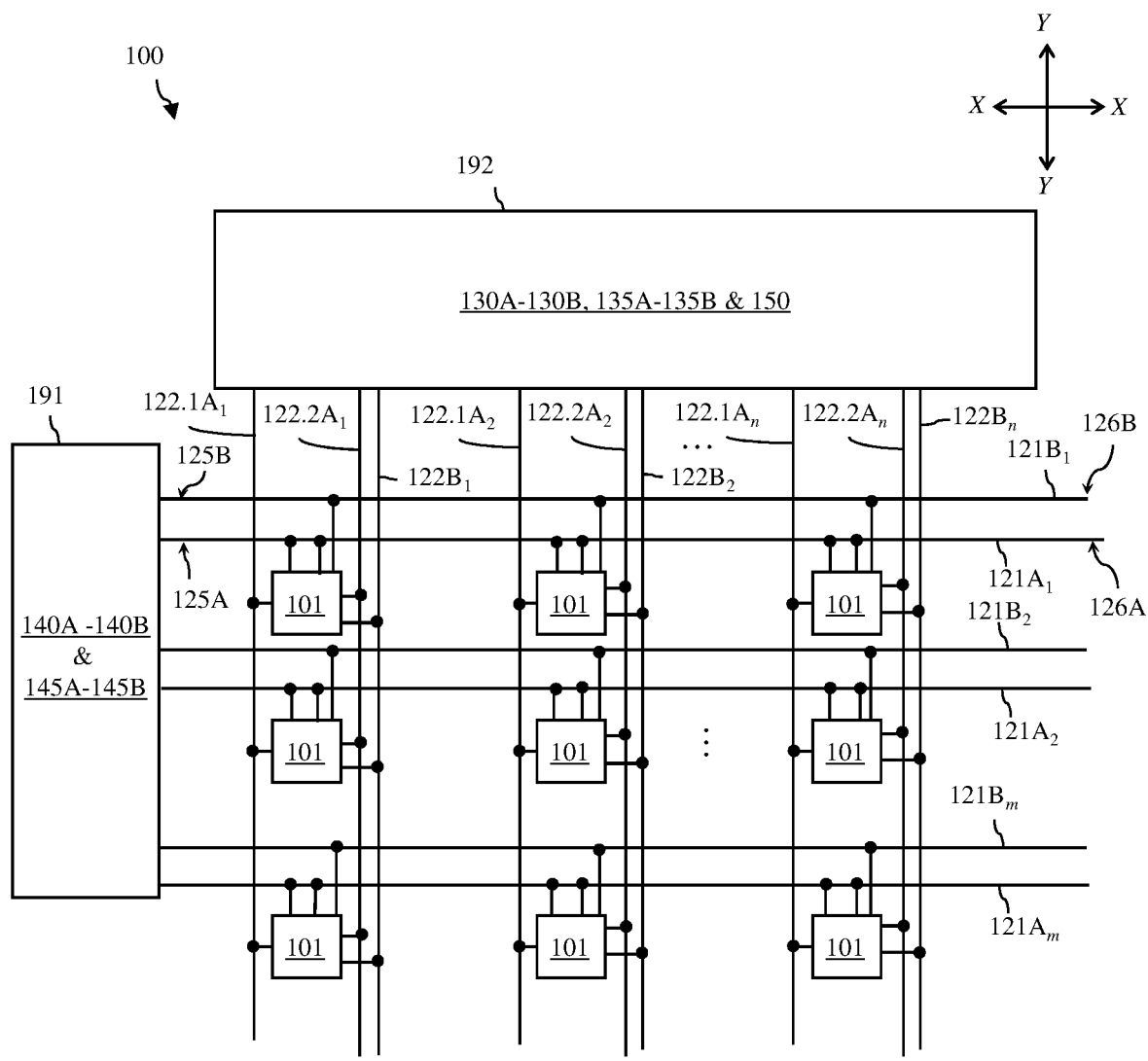

FIG. 1B is a schematic diagram illustrating multiple 2P-SRAM cells, such as the 2P-SRAM cell 101 of FIG. 1A, incorporated into an exemplary 2P-SRAM array 100. In this 2P-SRAM array 100, two separate ports are employed for double-ended write operations (i.e., employing a pair of bitlines) and for single-ended read operations (i.e., employing a single read bitline), respectively. For the double-ended write operations through the write port A, the first pass-gate transistor 111.1A and the second pass-gate transistor 111.2A, which are controlled by the write wordline 121A, and the first bitline 112.1A and the second bitline 112.2A are employed exclusively for double-ended write operations. If a data value of "1" (i.e., a high data value) is to be written to the first storage node 115.1, the first bitline 122.1A is pre-charged and the second bitline 122.2A is discharged to ground. Then, the write wordline 121A is activated to enable the first pass-gate transistor 111.1A and the second pass-gate transistor 111.2A and the data value "1" is stored. Contrarily, if a data value of "0" (i.e., a low data value) is to be written to the first storage node 115.1, the first bitline 122.1A is discharged to ground and the second bitline 122.2A is pre-charged. Then, the write wordline 121A is activated to enable the first pass-gate transistor 111.1A and the second pass-gate transistor 111.2A and the data value "0" is stored.

For the single-ended read operations through the read port B, the read bitline 122B is pre-charged. Then, the read wordline 121B is activated, turning on the additional pass-gate transistor 111B. If the data value stored in the first storage node 115.1 is a "1", then the second storage node 115.2 will be low. Thus, the additional pull-down transistor 113.3 will be on and the read bitline 122B will be discharged to a low voltage state. Contrarily, if the data value stored in the first storage node 115.1 is a "0", then the second storage node 115.2 will be high. Thus, the additional pull-down transistor 113.3 will be off and the read bitline 122B will remain at a high voltage state.

More specifically, this 2P-SRAM array 100 incorporates multiple 2P-SRAM cells 101 arranged in columns 1-n (each with a pair of bitlines $122.1A_{1-n}$ and $122.2A_{1-n}$, plus a read bitline $122B_{1-n}$) and rows 1-m (each with two wordlines $121A_{1-m}$ for the write port A and $121B_{1-m}$ for the read port B). For purposes of illustration, the rows are oriented in the X direction and the columns are oriented in the Y direction. However, it should be understood that the drawings are not intended to be limiting and that, alternatively, the rows could be oriented in the Y direction and the columns could be oriented in the X direction. The 2P-SRAM array 100 further includes peripheral circuitry 191-192 that, in response to control signals (e.g., row address and column address signals for selecting SRAM cells and read, write or standby signals for indicating the operations to be performed with respect to the selected SRAM cells), enables writing data values to a selected 2P-SRAM cell through the write port A and reading data values from the same 2P-SRAM cell or a different 2P-SRAM cell in the same row or a different row through the read port B. Peripheral circuitry 191 connected to the rows (at one end or at a combination of both ends) can include, for example, port A and port B row address decode logic 140A-140B and wordline drivers 145A-145B for activating the wordlines during port A write operations and port B read operations. Peripheral circuitry 192 connected to the columns (at one end or at a combination of both ends) can include, for example, column address decode logic 130A-130B and bitline drivers 135A-135B for appropriately biasing the bitlines during port A write operations and port B read operations. The peripheral circuitry 192 can also include a sense circuit 150 including sensing devices connected to the read bitlines $122B_{1-n}$. For example, single-input sensing devices (e.g., inverters or the like) can be employed to detect discharging of the read bitline in order to determine whether a selected SRAM cell in the column stores a data value of "1" or "0". Alternatively, a sense amplifier can be configured to compare the voltage on a read bitline of a column to a reference voltage (e.g., from a reference cell) in order to determine whether a selected SRAM cell in the column stores a data value of "1" or "0".

DP-SRAM arrays allow port A and port B write operations, port A and port B read operations, a port A write operation and port B read operation, or a port A read operation and a port B write operation of the same selected SRAM cell or different selected SRAM cells in the same row or different rows during the same clock cycle.

Figure 2A:
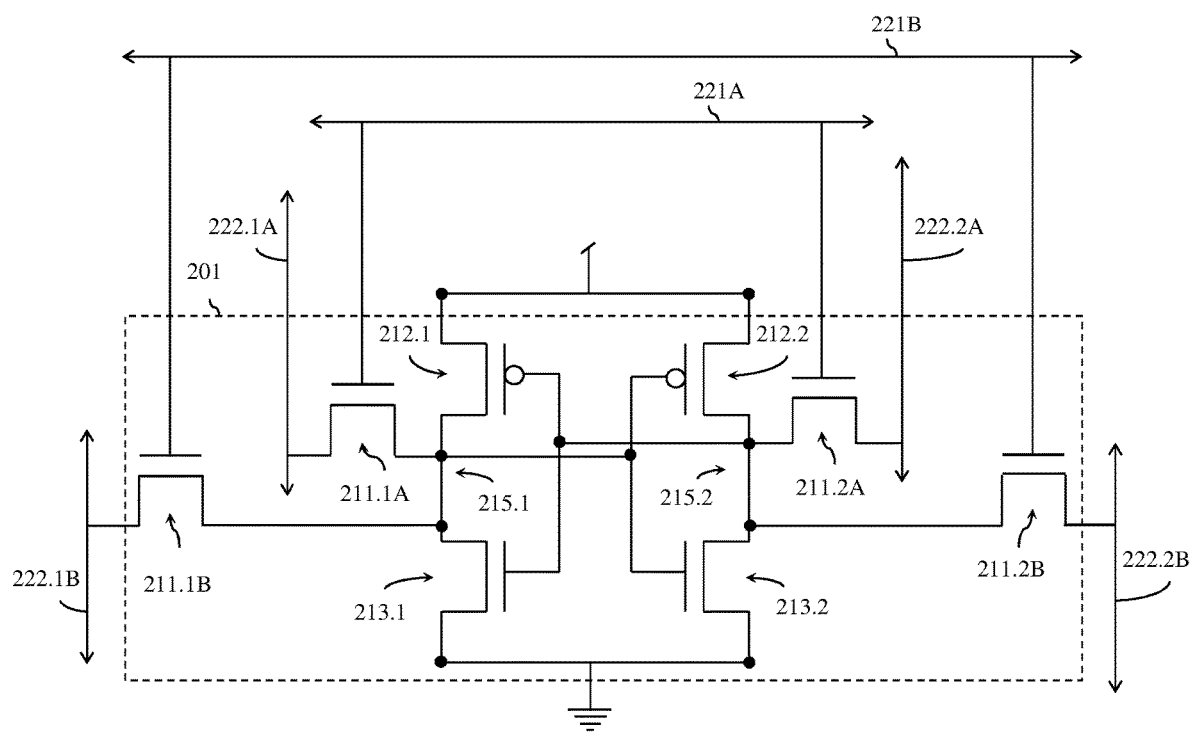
FIGS. 2A and 2B are schematic diagrams illustrating a dual-port static random access memory (DP-SRAM) cell and a DP-SRAM array, respectively.

FIG. 2A is a schematic diagram illustrating an exemplary DP-SRAM cell 201. The DP-SRAM cell 201 includes a first inverter and a second inverter. The first inverter is connected between a positive voltage rail and a ground rail and includes a first pull-up transistor 212.1 connected in series to a first pull-down transistor 213.1. The second inverter is also connected between the positive voltage rail and the ground rail and includes a second pull-up transistor 212.2 connected in series to a second pull-down transistor 213.2. In these cross-coupled inverters, the voltage level on a first storage node 215.1 at the interface between the first pull-up transistor 212.1 and the first pull-down transistor 213.1 controls the gates of the second pull-up transistor 212.2 and the second pull-down transistor 213.2 and the voltage level on a second storage node 215.2 at the interface between the second pull-up transistor 212.2 and the second pull-down transistor 213.2 controls the gates of the first pull-up transistor 212.1 and the first pull-down transistor 213.1.

This DP-SRAM cell 201 further includes a set of pass-gate transistors and a pair of bitlines for each of the two ports. Specifically, a first pass-gate transistor 211.1A selectively connects a first bitline 222.1A to the first storage node 215.1 and a second pass-gate transistor 211.2A selectively connects a second bitline 222.2A to the second storage node 215.2. An additional first pass-gate transistor 211.1B selectively connects an additional first bitline 222.1B to the first storage node 215.1 and an additional second pass-gate transistor 211.2B selectively connects an additional second bitline 222.2B to the second storage node 215.2. The voltage level on a first wordline 221A controls the gates of the pass-gate transistors in one pair (i.e., the first pass-gate transistor 211.1A and the second pass-gate transistor 211.2A) The voltage level on a second wordline 221B controls the gates of the pass-gate transistors of the other pair (i.e., the additional first pass-gate transistor 211.1B and the additional second pass-gate transistor 211.2B).

Figure 2B:
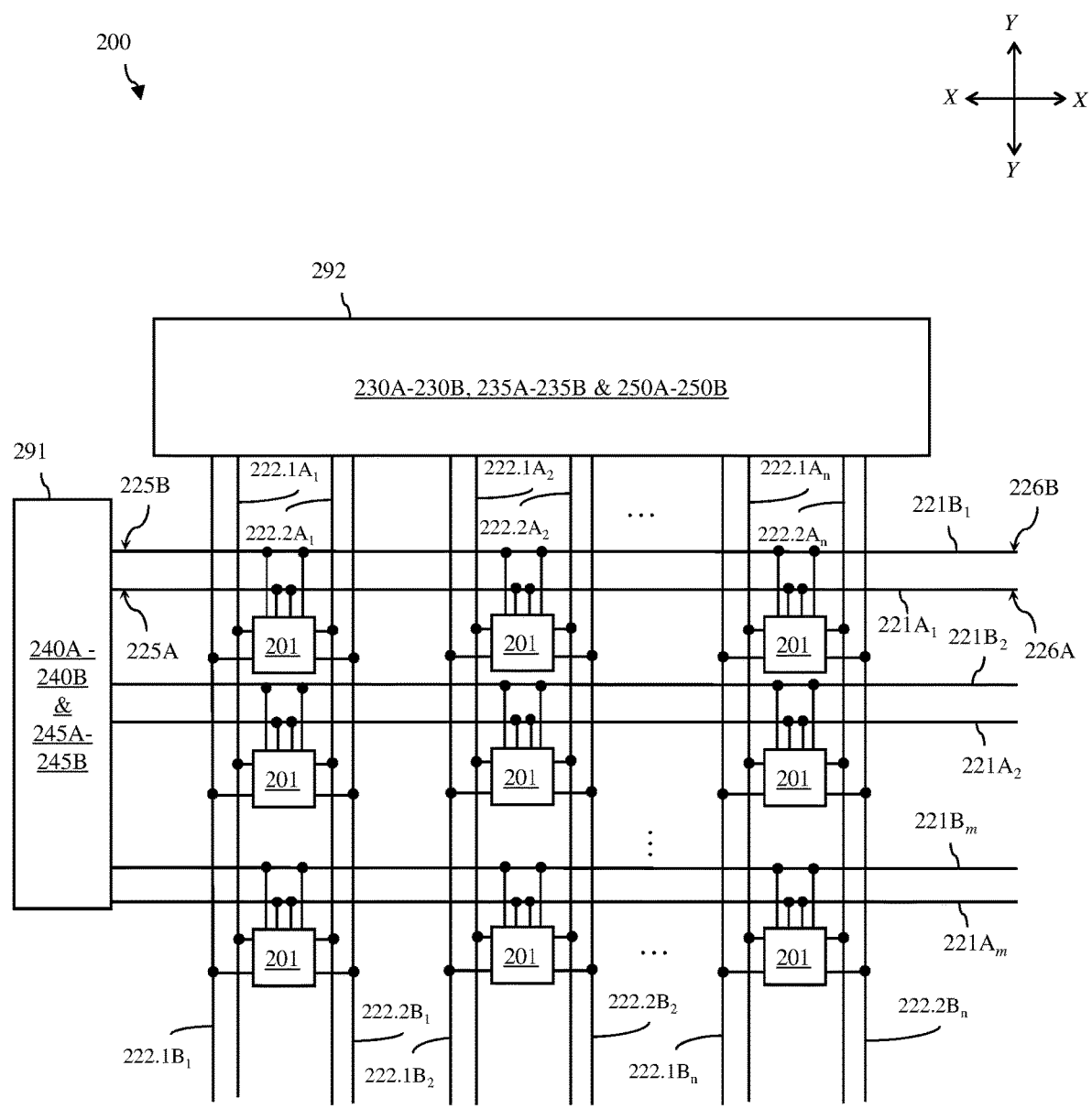

FIG. 2B is a schematic diagram illustrating multiple DP-SRAM cells, such as the DP-SRAM cell 201 of FIG. 2A, incorporated into an exemplary DP-SRAM array 200. In this DP-SRAM array 200, separate ports are employed for concurrent read/write operations. Specifically, the DP-SRAM array 200 incorporates multiple DP-SRAM cells 201 arranged in columns 1-n (each with a pair of bitlines $222.1A_{1-n}$ and $222.2A_{1-n}$ and an additional pair of bitlines $222.1B_{1-n}$ and $222.2B_{1-n}$) and rows 1-m (each with two wordlines $221A_{1-m}$ and $221B_{1-m}$). For purposes of illustration, the rows are oriented in the X direction and the columns are oriented in the Y direction. However, it should be understood that the drawings are not intended to be limiting and that, alternatively, the rows could be oriented in the Y direction and the columns could be oriented in the X direction. The DP-SRAM array 200 further includes peripheral circuitry 291-292 that facilitates writing data values to and reading data values from the DP-SRAM cells 201 in response to control signals (e.g., row address and column address signals for selecting SRAM cells and read, write or standby signals for indicating the operations to be performed on the selected SRAM cells). The peripheral circuitry 291 connected to the rows (at one end or at a combination of both ends) can include port A and port B row address decode logic 240A-240B and wordline drivers 245A-245B connected to the first wordlines $221A_{1-m}$ and the second wordlines $221B_{1-m}$ for activating those wordlines during port A and port B read and/or write operations, respectively. The peripheral circuitry 292 connected to the columns (at one end or at a combination of both ends) can further include port A and port B column address decode logic 230A-230B and bitline drivers 235A-235B connected to the pairs of bitlines $222.1A_{1-n}$-$222.2A_{1-n}$ and $222.1B_{1-n}$-$222.2B_{1-n}$ for appropriately biasing the pairs of bitlines during port A and port B read and/or write operations, respectively. The peripheral circuitry 292 can also include sense circuits 250A-250B. In the sense circuit 250A, sense amplifiers can be connected to corresponding pairs of bitlines $222.1A_{1-n}$-$222.2A_{1-n}$ at the end of each column and each sense amplifier in the sense circuit 250A can be configured to compare the voltages on that pair of bitlines during a port A read operation in order to determine whether a selected SRAM cell in the column stores a data value of "1" or "0". Similarly, in the sense circuit 250B, sense amplifiers can be connected to corresponding pairs of bitlines $222.1B_{1-n}$-$222.2B_{1-n}$ at the end of each column and each sense amplifier in the sense circuit 250B can be configured to compare the voltages on that pair of bitlines during a port B read operation in order to determine whether a selected SRAM cell in the column stores a data value of "1" or "0".

Those skilled in the art will recognize that in the multi-port memory cells 101, 201 described above and illustrated in FIGS. 1A and 2A, the pull-up transistors are p-type field effect transistors (PFETs) and the pass-gate and pull-down transistors are n-type field effect transistors (NFETs). Additionally, those skilled in the art will recognize that the multi-port memory arrays 100, 200 described above have essentially twice the bandwidth of conventional single-port memory arrays. However, due to the more complex wiring schemes required to enable such multi-port configurations and also due to the decrease in memory cell size and increase wire density with each new technology node, an increase in coupling of the two wordlines 121A-121B, 221A-221B for each row has resulted in an increase in the rate of write and read fails. More specifically, fail-inducing wordline coupling can be problematic for multi-port memory arrays. This fail-inducing wordline coupling occurs primarily when one wordline of a given row (referred to as an aggressor wordline) is transitioning from high to low and the other wordline of the same row (referred to as a victim wordline) is transitioning from low to high. In this case, coupling between the aggressor and victim wordlines causes an increase in the resistive-capacitive (RC) delay exhibited by the victim wordline, thereby increasing the time it takes for that victim wordline to achieve the full positive voltage level (e.g., the cell supply voltage (VCS)). If the victim wordline does not achieve the full positive voltage level within the time allotted, then a write or read fail occurs (depending upon the operation being performed).

Figure 3A:
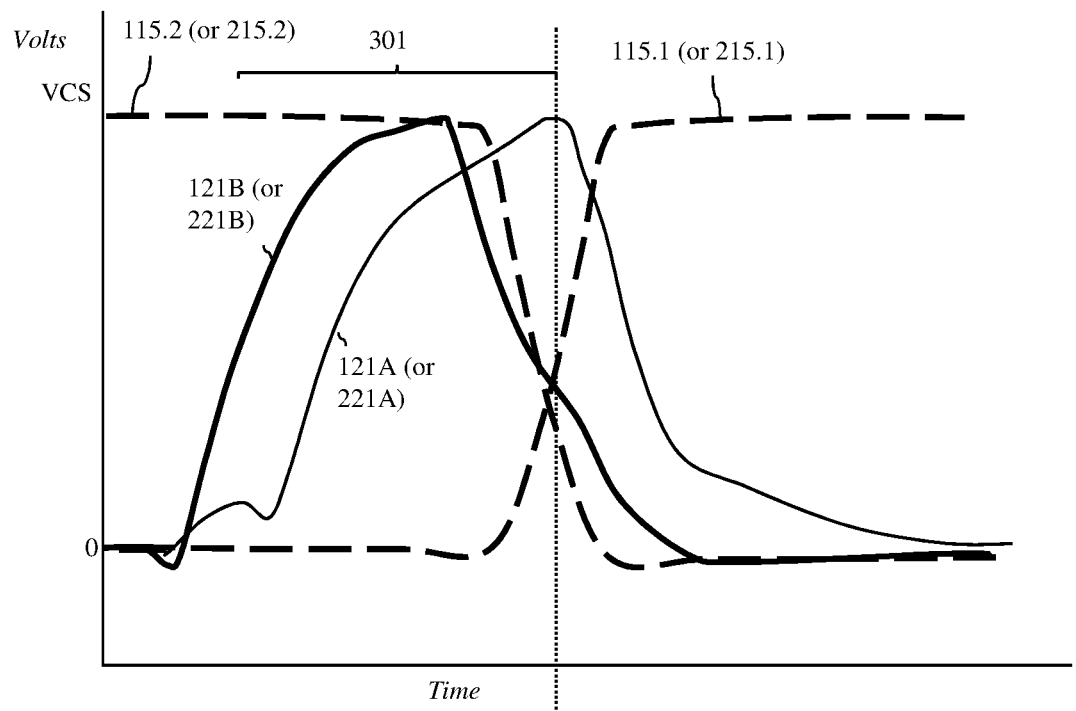
FIG. 3A is a graph illustrating voltage transitions on adjacent wordlines for a row and on the storage nodes of a selected memory cell when a port A write operation follows a port B read or other operation in the same access period.

For example, FIG. 3A is an exemplary voltage diagram illustrating ideal voltage transitions on a first wordline (e.g., the first wordline 121A of FIGS. 1A-1B or 221A of FIGS. 2A-2B), a second wordline (e.g., the second wordline 121B of FIGS. 1A-1B or 221B of FIGS. 2A-2B) in the same row, and the first and second storage nodes of a selected multi-port memory cell (e.g., storage nodes 115.1 and 115.2 of a 2P-SRAM cell 101 of FIGS. 1A-1B or storage nodes 215.1 and 215.2 of a DP-SRAM cell 201 of FIGS. 2A-2B) when a port B read operation and a port A write operation (e.g., to switch the data value stored in the first storage node 115.1, 215.1 from a "0" to a "1") are performed with respect to the same memory cell or different memory cells in the same row during the same clock cycle. When these two operations are initiated, the voltage on the first storage node 115.1, 215.1 of the selected memory cell 101, 201 is low and the voltage level on the second storage node 115.2, 215.2 is high, indicating that the current data value stored in the selected memory cell 101, 201 is a "0". For a port B read operation of that selected memory cell or another selected memory cell within the same row, the second wordline 121B, 221B will be activated and the data value stored therein will be read. For the port A write operation with respect to the selected memory cell, the first wordline 121A, 221A can be activated in the same clock cycle some period of time following activation of the second wordline 121B, 221B and that first wordline 121A, 221A should reach the full VCS level within a set period of time before being deactivated. As a result, the voltage on the first storage node 115.1, 215.1 of the selected memory cell 101, 201 will be pulled high (i.e., to VCS) and the voltage on the second storage node 115.2, 215.2 will be pulled low, thereby completing the operation to write a "1" to the first storage node 115.1, 215.2 of the selected memory cell 101, 201.

Figure 3B:
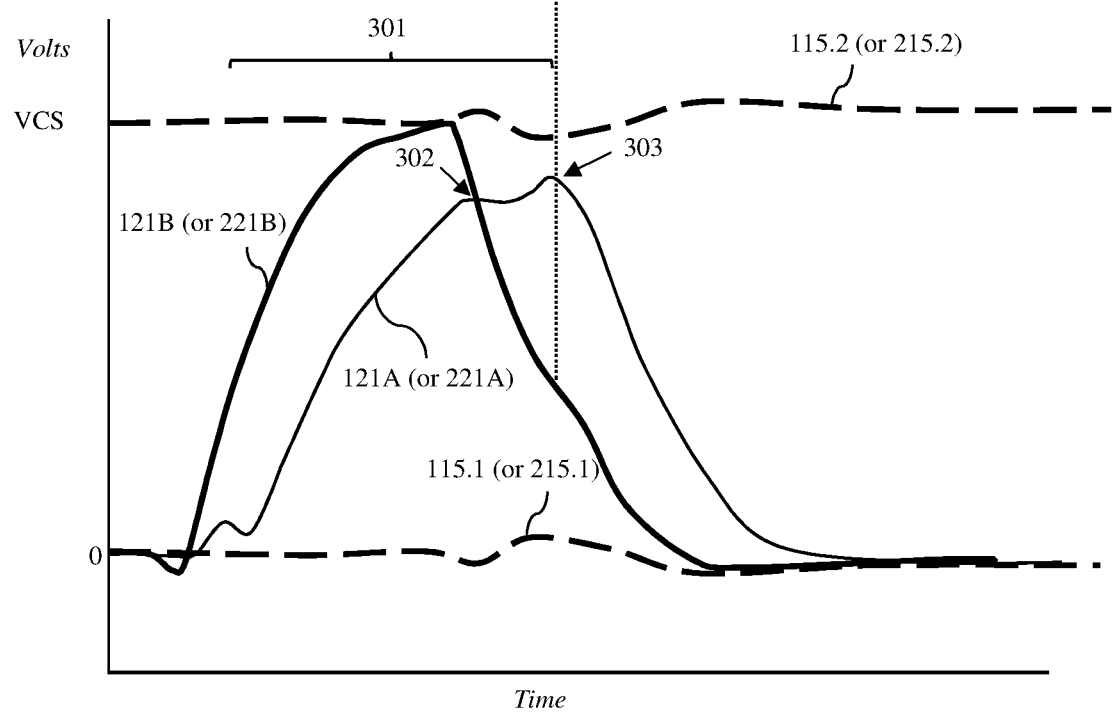
FIG. 3B is a graph illustrating voltage transitions on adjacent wordlines for a row and on the storage nodes of a selected memory cell when a port A write operation follows a port B read or other operation in the same access period and a write fail occurs due to wordline coupling.

If, however, coupling occurs between the two wordlines 121A-121B, 221A-221B for the row, the port A write operation can fail. Specifically, FIG. 3B is an exemplary voltage diagram illustrating the voltage transitions on the first wordline 121A, 221A, the second wordline 121B, 221B and the two storage nodes 115.1-115.2, 215.1-215.2 of the selected memory cell being written to during these same operations described above with respect to FIG. 3A (i.e., when a port B read operation and a port A write operation are performed on the same or different memory cells in the same row) and when due to the wire density in the memory array 100, 200 and due to the timing of activation/deactivation of the wordlines, coupling occurs between the two wordlines 121A-121B, 221A-221B of the row at issue. When the second wordline 121B, 221B (or aggressor wordline in this example) begins transitioning from high to low at the end of the port B read operation at the same time as the first wordline 121A, 221A (or victim wordline in this example) is transitioning from low to high at the beginning of the port A write operation and wordline coupling occurs, then the resistive-capacitive (RC) effects of this coupling can result in RC delay on the victim wordline 121A, 221A. Specifically, this RC delay slows the rise time 301 of the first wordline 121A, 221A (see the change in the rate of the voltage increase on the first wordline 121A, 221A beginning at point 302 when the voltage on the second wordline 121B, 221B begins to transition from high to low). At the slow-fast process corner (i.e., when the n-type field effect transistors within the cell have 36 fast switching speeds and the p-type field effect transistors within the cell have 36 slow switching speeds), this slower rise time 301 can result in the voltage on the first wordline 121A, 221A failing to reach the full VCS level within some desired amount of time or before the first wordline 121A, 221A is deactivated at point 303 and begins to transition back to a low voltage. In this case, the voltage on the first storage node 115.1, 215.1 of the selected memory cell 101, 201 being written to is not fully pulled up (i.e., does not reach VCS) and the voltage on the second storage node 115.2, 215.2 is not pulled down and, thus, a data value of "1" is not stored in the first storage node 115.1, 215.1 of the selected memory cell 101, 201 during the port A write operation (i.e., the memory cell exhibits a write fail).

The inventors of the present invention have noted that, in each of the above-described memory arrays 100, 200, the negative impacts of coupling between the two wordlines 121A-121B, 221A-221B of a given row are less prevalent at the proximal ends 125A-125B, 225A-225B of those wordlines adjacent to the wordline drivers 145A-145B, 245A-245B because the drive strength of the wordline drivers 145A-145B, 245A-245B is sufficient to overcome the RC effects at the proximal ends. Unfortunately, the RC effects dominate at the distal ends 126A-126B, 226A-226B of the wordlines farthest from the wordline drivers 145A-145B, 245A-245B, respectively, such that simply increasing the drive strength of the wordline drivers 145A-145B, 245A-245B is not an adequate solution to avoid write and/or read errors.

In view of the foregoing, disclosed herein is a multi-port memory array (e.g., a two port-static random access memory (2P-SRAM) array or a dual port-static random access memory (DP-SRAM) array) that incorporates voltage boost circuits for automatically boosting the voltage on wordlines to minimize resistance-capacitance (RC) delay caused by coupling between adjacent wordlines when certain conditions are met.

Figure 4:
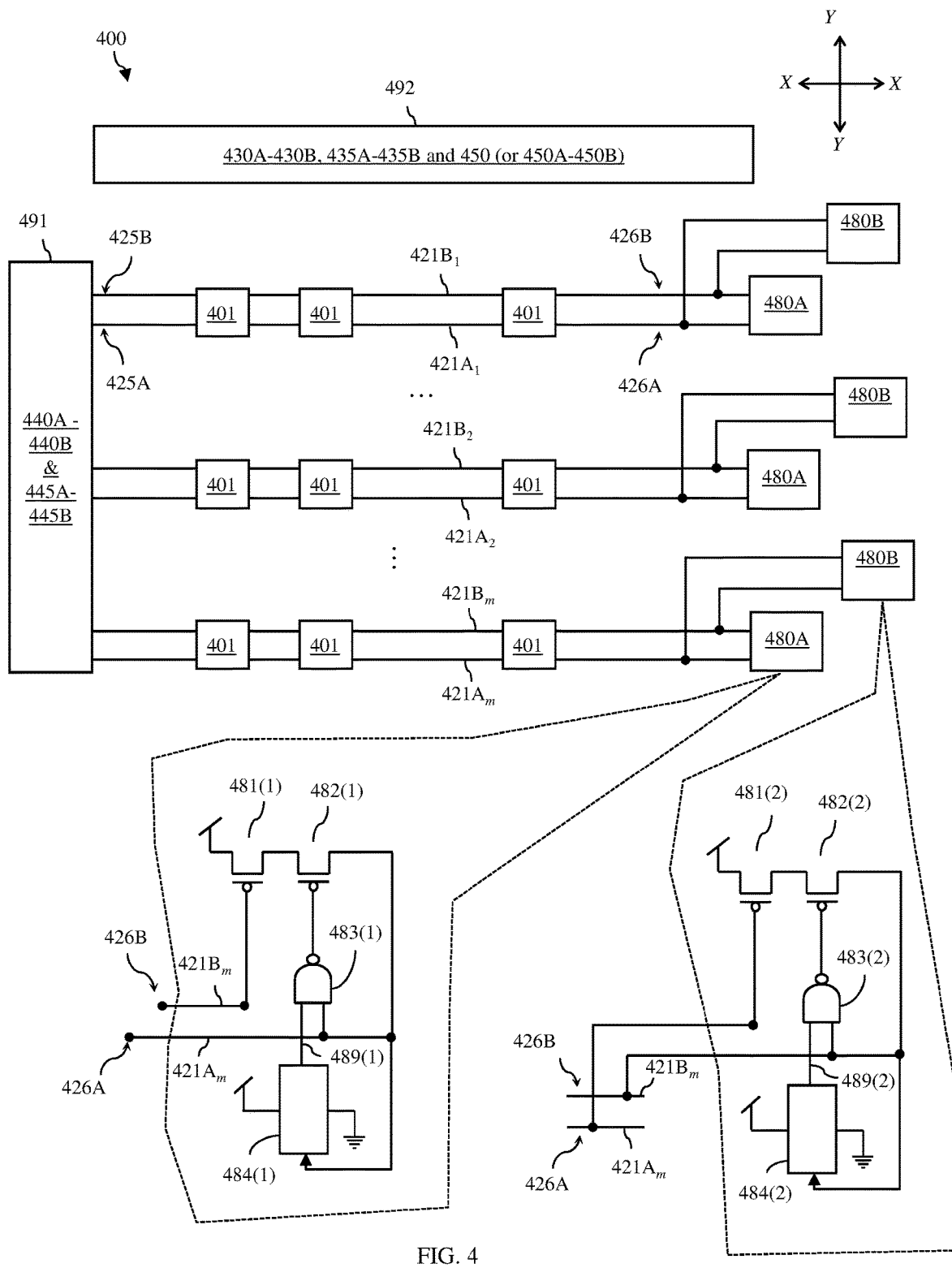
FIG. 4 is a schematic diagram illustrating an embodiment of a multi-port memory array with voltage boost circuits for wordline coupling mitigation.
Figure 5:
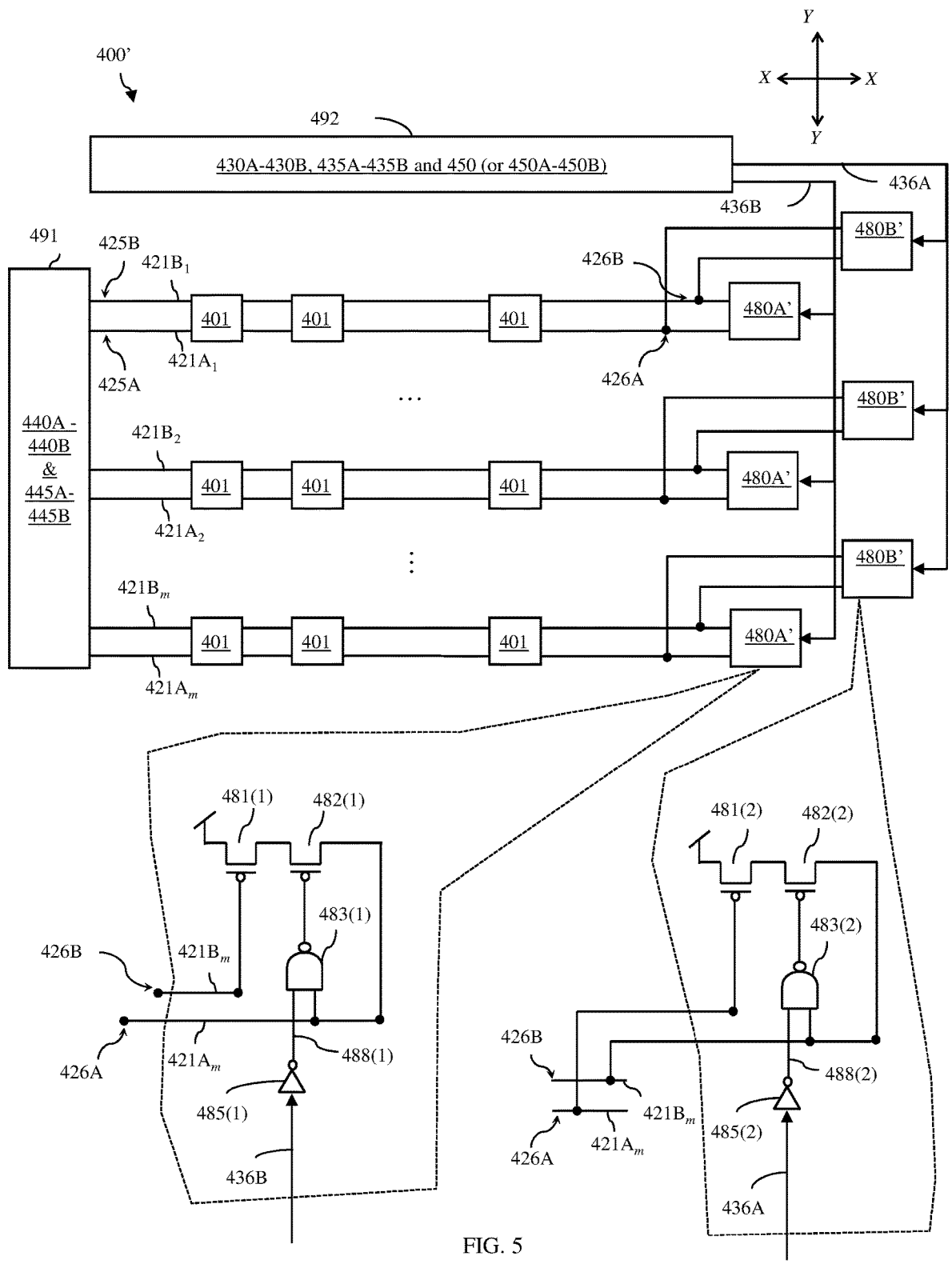
FIG. 5 is a schematic diagram illustrating another embodiment of a multi-port memory array with voltage boost circuits for wordline coupling mitigation.

FIGS. 4 and 5 are schematic diagrams illustrating disclosed multi-port memory array embodiments 400 and 400', respectively. Each of these embodiments 400, 400' includes multiple multi-port memory cells 401 arranged in columns and rows. For purposes of illustration, the rows are oriented in the X direction and the columns are oriented in the Y direction. However, it should be understood that the drawings are not intended to be limiting and that, alternatively, the rows could be oriented in the Y direction and the columns could be oriented in the X direction.

Figure 6:
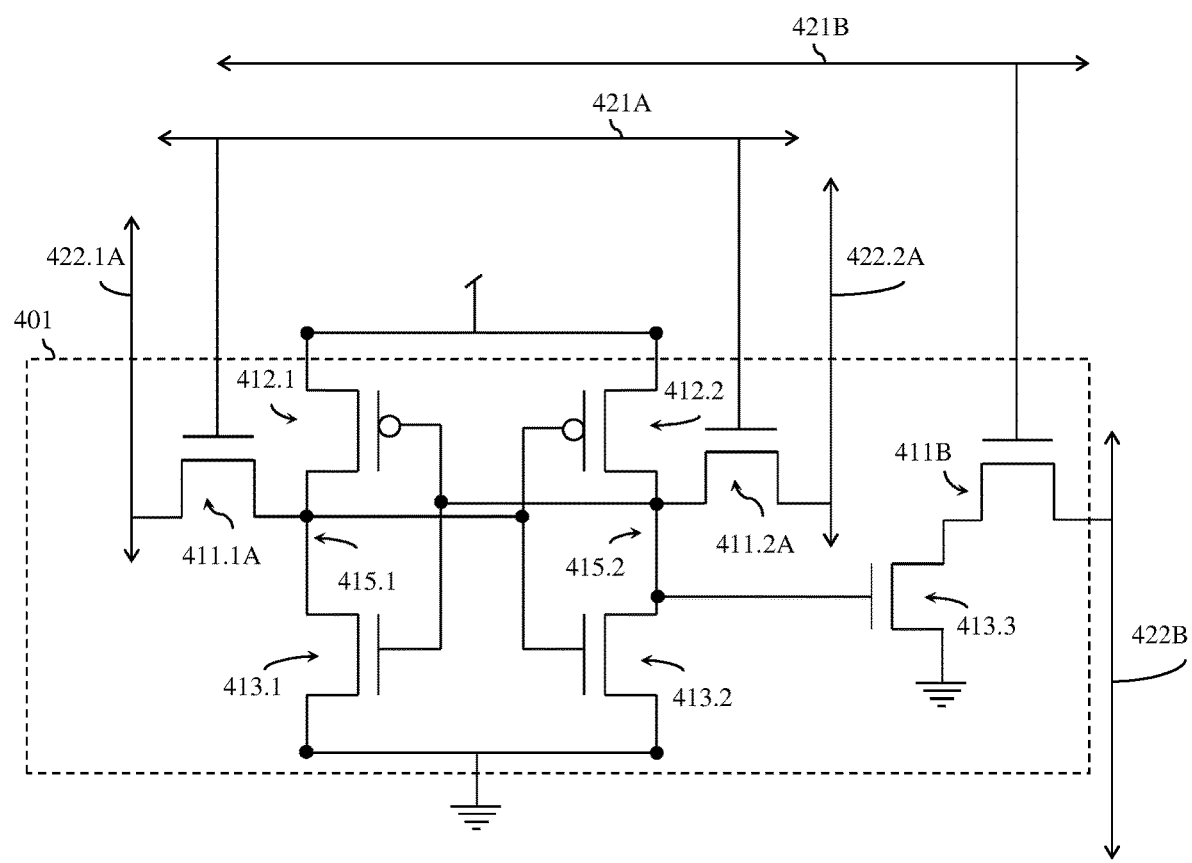
FIG. 6 is a schematic diagram illustrating a 2P-SRAM cell that can be incorporated into the multi-port memory array of FIG. 4 or FIG. 5.
Figure 7:
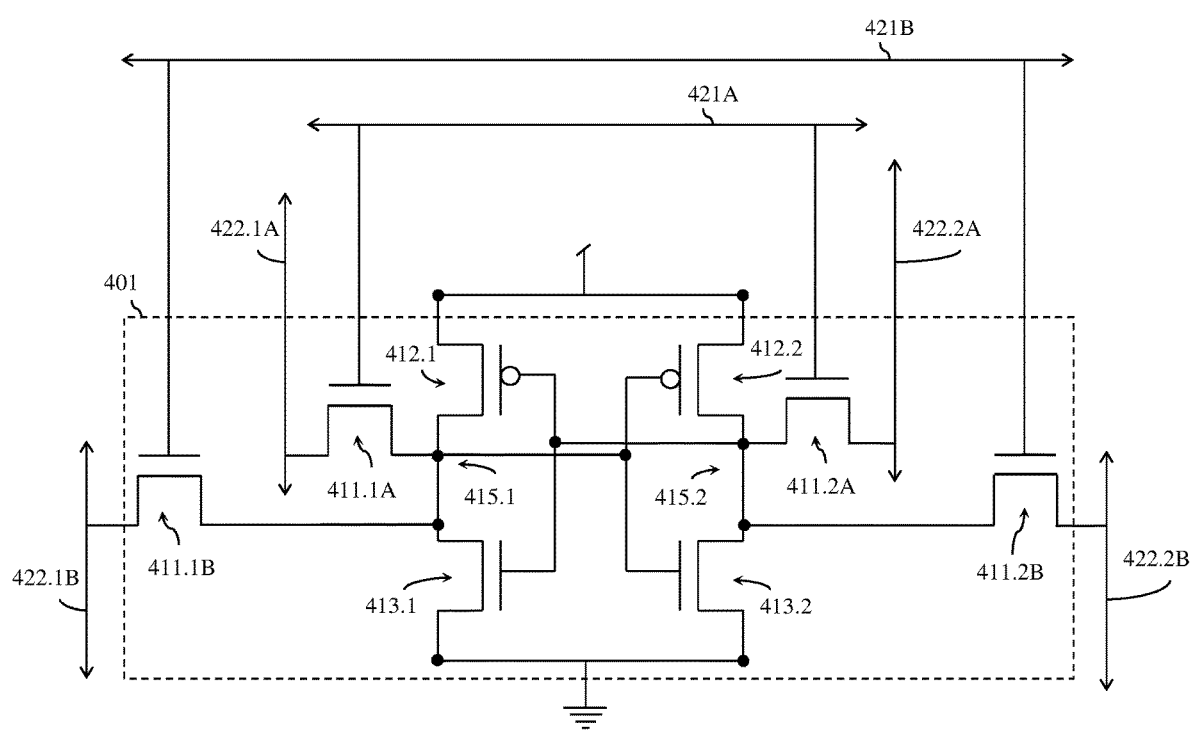
FIG. 7 is a schematic diagram illustrating a DP-SRAM cell that can be incorporated into the multi-port memory array of FIG. 4 or FIG. 5.

The multi-port memory cells 401 can be, for example, two-port static random access memory (2P-SRAM) cells, as illustrated in FIG. 6, which are configured essentially the same as the 2P-SRAM cell 101 described in detail above. Alternatively, the multi-port memory cells 401 can be dual-port static random access memory (DP-SRAM) cells, as illustrated in FIG. 7, which are configured essentially the same as the DP-SRAM cell 201 described in detail above.

More specifically, each multi-port memory cell 401 can include a first inverter cross-coupled with a second inverter. The first inverter can be connected between a positive voltage rail and a ground rail and can include a first pull-up transistor 412.1 connected in series to a first pull-down transistor 413.1. The second inverter can also be connected between the positive voltage rail and the ground rail and can include a second pull-up transistor 412.2 connected in series to a second pull-down transistor 413.2. In these cross-coupled inverters, the voltage level on a first storage node 415.1 at the interface between the first pull-up transistor 412.1 and the first pull-down transistor 413.1 can control the gates of the second pull-up transistor 412.2 and the second pull-down transistor 413.2 and the voltage level on a second storage node 415.2 at the interface between the second pull-up transistor 412.2 and the second pull-down transistor 413.2 can control the gates of the first pull-up transistor 412.1 and the first pull-down transistor 413.1.

Additionally, each multi-port memory cell 401 (i.e., whether it's a 2P-SRAM cell as in FIG. 6 or a DP-SRAM as in FIG. 7) can further include, for port A operations: a first wordline 421A; a pair of pass-gate transistors 411.1A and 411.1B; and a pair of bitlines 422.1A and 422.1B. Specifically, the first pass-gate transistor 411.1A can be connected between the first bitline 411.1A and the first storage node 415.1, the second pass-gate transistor 411.2A can be connected between the second bitline 411.2A and the second storage node 415.2 and the gates of the first pass-gate transistor 411.1A and the second pass-gate transistor 411.2A can be controlled by the voltage level on the first wordline 421A so that the first bitline 422.1A and the second bitline 422.2A can be selectively connected to the first storage node 415.1 and the second storage node 415.2, respectively, during port A operations.

In the case of a 2P-SRAM cell, as illustrated in FIG. 6, each memory cell 401 can further include, for port B read only operations: a second wordline 421B (referred to as a read wordline); an additional bitline 422B (referred to as a read bitline in this case); and two additional transistors. Specifically, an additional pass-gate transistor 411B and an additional pull-down transistor 413.1 can be connected in series between the read bitline 422B and ground. Furthermore, the gate of the additional pass-gate transistor 411B can controlled by the voltage level on the read wordline 121B and the gate of the additional pull-down transistor 413.3 can be controlled by the voltage level on the second storage node 415.2.

Alternatively, in the case of a DP-SRAM cell, as illustrated in FIG. 7, the memory cell 401 can further include, for port B read/write operations: a second wordline 421B; an additional pair of pass-gate transistors 411.1B and 411.2B; and an additional pair of bitlines 422.1B and 422.2B. Specifically, an additional first pass-gate transistor 411.1B can selectively connect an additional first bitline 422.1B to the first storage node 415.1 and an additional second pass-gate transistor 411.2B can selectively connect an additional second bitline 422.2B to the second storage node 415.2. The gates of the additional pair of pass-gate transistors (i.e., the additional first pass-gate transistor 411.1B and the additional second pass-gate transistor 411.2B) can be controlled by the voltage level on the second wordline 421B.

Alternatively, the multi-port memory cells 401 can have any other suitable multi-port memory cell configuration so that within the memory array 400, 400' each cell in a given column is connected to at least one pair of bitlines (e.g., one pair of bitlines, one pair plus an additional bitline, two pairs of bitlines, etc.) and each cell in a given row is connected to two different wordlines, which enable memory cell access through two different ports, respectively. Thus, it should be understood that the disclosed multi-port memory array embodiments 400, 400' can be a 2P-SRAM array (e.g., as shown in FIG. 1B with one pair of bitlines, plus a read bitline, per column and discussed in detail above), a DP memory array (e.g., as shown in FIG. 2B with two pairs of bitlines per column and discussed in detail above), or any other type of multi-port memory array depending upon the type of multi-port memory cells incorporated therein.

FIGS. 4 and 5 illustrate the claimed features of the disclosed multi-port memory array embodiments 400, 400'. It should be understood that additional well-known features of multi-port memory arrays have been omitted from the figures in order to avoid clutter and better highlight the salient aspects of the disclosed embodiments. For example, as discussed above, the present invention is directed to wordline coupling mitigation structures and methods and can be employed in different types of multi-port memory arrays (e.g., a 2P-SRAM array, a DP-SRAM array, etc.). Therefore, in order to avoid clutter and enable the reader to better focus on the salient aspects of the disclosed multi-port memory array embodiments 400, 400', the bitlines for the columns and their respective connections to the memory cells 401 (e.g., as shown in the arrays of FIGS. 1B and 2B) have been omitted from FIGS. 4 and 5. However, it should be understood that the Figures are not intended to be limiting and that the disclosed multi-port memory array embodiments 400, 400' include bitlines as well as the peripheral circuitry necessary to enable write operations and read operations.

More specifically, it should be understood that, for a 2P-SRAM array, the disclosed embodiments 400, 400' incorporate multiple 2P-SRAM cells, as shown in FIG. 6, arranged in columns (each with a pair of bitlines, plus a read bitline) and rows 1-m (each with two wordlines). For a DP-SRAM array, the disclosed embodiments 400, 400' incorporate multiple DP-SRAM cells, as shown in FIG. 7, arranged in columns (each with two pair of bitlines) and rows 1-m (each with two wordlines). Additionally, the disclosed multi-port memory array embodiments 400, 400' can include peripheral circuitry 491-492 configured to enable multi-port access to the memory cells 401 within the array in response to control signals (e.g., row address and column address signals for selecting SRAM cells and read, write or standby signals for indicating the operation to be performed with respect to that selected SRAM cells). For a 2P-SRAM memory array, the peripheral circuitry 491-492 can facilitate writing data values to selected memory cells 401 through the write port A and reading data values from selected memory cells 401 through the read port B. For a DP-SRAM array, the peripheral circuitry 491-492 can facilitate writing data values to and reading data values from selected memory cells 401 through either port. In either case, the peripheral circuitry 491 for the rows can be connected to the rows (at one end, as illustrated, or alternatively at a combination of both ends) and can include, for example, port A and port B row address decode logic 440A-440B and wordline drivers 445A-445B for activating the wordlines during port A and port B operations, respectively. Peripheral circuitry 492 for the columns can be connected to the columns (at one end or at a combination of both ends) and can include, for example, column address decode logic 430A-430B and bitline drivers 435A-435B for appropriately biasing bitlines during port A and port B read operations. For a 2P-SRAM array, the peripheral circuitry 492 for the columns can also include a sense circuit 450 for single-ended sensing operations through port B only. For a DP-SRAM array, the peripheral circuitry 492 for the columns can also include two sense circuits 450A-450B for double-ended sensing operations through both port A and port B, respectively. The sense circuits 450A-450B can be located at one end of the columns (as shown) or, alternatively, at opposite ends of the columns.

Additionally, in order to prevent or at least minimize the negative impacts of coupling between the two wordlines for each row (i.e., the first wordline 421A, which enables access to the memory cells in the row through a first port, and the second wordline 421B, which enables access to the memory cells in the row through a second port), the disclosed multi-port memory array embodiments 400, 400' can further include wordline coupling mitigation structures and, particularly, voltage boost circuits. Specifically, each row in the memory array 400, 400' can include a first voltage boost circuit (e.g., see the first voltage boost circuits 480A of the multi-port memory array 400 of FIG. 4 and the first voltage boost circuits 480A' of the multi-port memory array 400' of FIG. 5) and, optionally, a second voltage boost circuit (e.g., see the second voltage boost circuits 480B of the multi-port memory array 400 of FIG. 4 and the second voltage boost circuits 480B' of the multi-port memory array 400' of FIG. 5).

Each first voltage boost circuit 480A, 480A' can be electrically connected to both the first wordline 421A and second wordline 421B for a row and can be configured to boost a first voltage on the first wordline 421A during an access period when the first voltage is transitioning from a low voltage level toward a high voltage level for memory cell access through the first port (i.e., port A) and when, concurrently, a second voltage on the second wordline 421B is either at the low voltage level or transitioning from the high voltage level to the low voltage level immediately following memory cell access through the second port (i.e., port B). Port A memory cell access and port B memory cell access during this access period can be to the same selected memory cell or to different selected memory cells within same row such that wordline coupling could result in a fail.

If present, the second voltage boost circuit 480B, 480B' can be configured similarly to the first voltage boost circuit 480A, 480A' but can be connected to the first wordline 421A and the second wordline 421B in such a way that enables boosting of the second voltage on the second wordline 421B during a different access period when the second voltage is transitioning from the low voltage level toward the high voltage level for memory cell access through the second port (i.e., port B) and when, concurrently, the first voltage on the first wordline 421A is either at the low voltage level or transitioning from the high voltage level to the low voltage level immediately following memory cell access through the first port (i.e., port A). Again, the port A memory cell access and port B memory cell access during this access period can be to the same selected memory cell or to different selected memory cells within same row such that wordline coupling could result in a fail.

It should be noted that, while errors due to wordline coupling can occur during both write operations and read operations, such errors are most prevalent during write operations when changing the stored data value from a "0" to a "1" or from a "1" to a "0". Thus, in a DP-SRAM array, where both port A and port B can be used to perform write and read operations, ideally the two wordlines 421A-421B of each row will be connected to both a first voltage boost circuit 480A, 480A' (in order to boost the first voltage on the first wordline 421A during port A write and read operations when the second voltage on the second wordline 421B is low or transitioning from high to low) and a second voltage boost circuit 480B, 480B' (in order to boost the second voltage on the second wordline 421B during port B write and read operations when the first voltage on the first wordline 421A is low or transitioning from high to low). However, in a 2P-SRAM array, where port A is used exclusively for performing write operations and port B is used exclusively for performing read operations, a designer may elect to incorporate both the first voltage boost circuits 480A, 480A' for the port A write operations and the second voltage boost circuits 480B, 480B' for the port B read operations. Alternatively, a designer may elect to incorporate only the first voltage boost circuits 480A, 480A' for port A write operations and to forego boosting of the second wordlines during the port B read operations. By employing voltage boost circuits for only port A write operations, the number of voltage boost circuits is reduced, thereby reducing chip area consumption and circuit complexity.

As mentioned above, the negative impact of wordline coupling (i.e., resistance-capacitance (RC) delay caused by wordline coupling) is also negligible at the proximal ends 425A-425B of the wordlines 421A-421B closest to the wordline drivers 445A-445B and worsens as the distance from the wordline drivers 445A-445B increases (i.e., at the distal ends of the wordlines). Thus, the first voltage boost circuits 480A 480A' and optional second voltage boost circuits 480B, 480B' in the multi-port memory array embodiments 400, 400' can each be electrically connected to a corresponding pair of wordlines 421A-421B for a given row at or near the distal ends 426A-426B of those wordlines farthest from the wordline drivers 445A-445B. Specifically, in each row, the first wordline 421A has a first proximal end 425A adjacent to the wordline drivers 445A and a first distal end 426A opposite the first proximal end 425A and, similarly, the second wordline 421B has a second proximal end 425B adjacent to the wordline drivers 445B and a second distal end 426B opposite the second proximal end 425B. The first voltage boost circuit 480A, 480A' and, if included, the second voltage boost circuit 480B, 480B' can be electrically connected to the first wordline 421A at or near the first distal end 426A and to the second wordline 421B at or near the second distal end 426B.

The disclosed multi-port memory array embodiments 400, 400' provide an integrated self-assist wordline coupling mitigation solution because the signals used to control the timing of the first voltage boost circuits 480A, 480A' and the optional second voltage boost circuits 480B, 480B' are internally generated within the memory array itself. The disclosed multi-port memory array embodiments 400, 400' differ in that the configuration of the first voltage boost circuit 480A shown in FIG. 4 and the internally generated signals used to control the timing of that circuit are different from the configuration of the first voltage boost circuit 480A' shown in FIG. 5 and the internally generated signals used to control the timing of that circuit. Furthermore, the configuration of the optional second voltage boost circuit 480B shown in FIG. 4 and the internally generated signals used to control the timing of that circuit are different from the configuration of the second voltage boost circuit 480B' shown in FIG. 5 and the internally generated signals used to control the timing of that circuit. These differences are discussed in greater detail below.

Specifically, referring to the multi-port memory array embodiment 400 of FIG. 4, each first voltage boost circuit 480A (which will provide a voltage boost or assist to the first wordline 421A of a given row) can include two first p-type field effect transistors (PFETs) 481(1) and 482(1) electrically connected in series between a positive supply voltage (e.g., VCS) and a node on the first wordline 421A at or near the first distal end 426A. The first voltage boost circuit 480A can further include a first delay circuit 484(1) (e.g., a buffer delay circuit) and a first NAND gate 483(1). As illustrated, the gate of the PFET 481(1) can be electrically connected to a node on the second wordline 421B at or near the second distal end 426B such that the on/off state of the PFET 481(1) is controlled by a second wordline voltage signal received from the second wordline 421B. The gate of the PFET 482(1) can be electrically connected to the output of the first NAND gate 483(1) such that the on/off state of the PFET 482(1) is controlled by a logic value output from the first NAND gate 483(1). The first delay circuit 484(1) can be electrically connected in series between a node on the first wordline 421A at or near the first distal end 426A and an input to the first NAND gate 483(1). The other input to the first NAND gate 483(1) can also be connected to a node on the first wordline 421A.

With this configuration, the first voltage boost circuit 480A will boost the first voltage on the first wordline 421A only when both of the PFETs 481(1) and 482(1) are turned on. In operation, the first delay circuit 484(1) can capture (i.e., receive) the first wordline voltage signal from the first wordline 421A (on a node at or near the first distal end 426A). The first delay circuit 484(1) can further be configured to delay this first wordline voltage signal for a specific time period and to output a delayed first wordline voltage signal 489(1). The first NAND gate 483(1) can capture (i.e., receive) the delayed first wordline voltage signal 489(1) from the first delay circuit 484(1) and the first wordline voltage signal (captured from a node on the first wordline 421A at or near the first distal end 426A) and can be configured to output a logic value according to a standard truth table for a NAND gate. That is, the first NAND gate 483(1) will output a high logic value unless both the delayed first wordline voltage signal 489(1) and the first wordline voltage signal are above a first predetermined level (i.e., a threshold level at which the first NAND gate reads the signals as being high logic values or logic values of "1") at which point the first NAND gate 483(1) will output a low logic value (i.e., a logic value of "0"). Once the first NAND gate's output has a low logic value, the PFET 482(1) will turn on. The PFET 481(1) is turned on only when the second wordline voltage signal (i.e., the second voltage signal captured from a node at or near the distal end 426B of the second wordline 421B) is below a second predetermined level (e.g., when the second wordline is either already low or transitioning from high to low).

Figure 8:
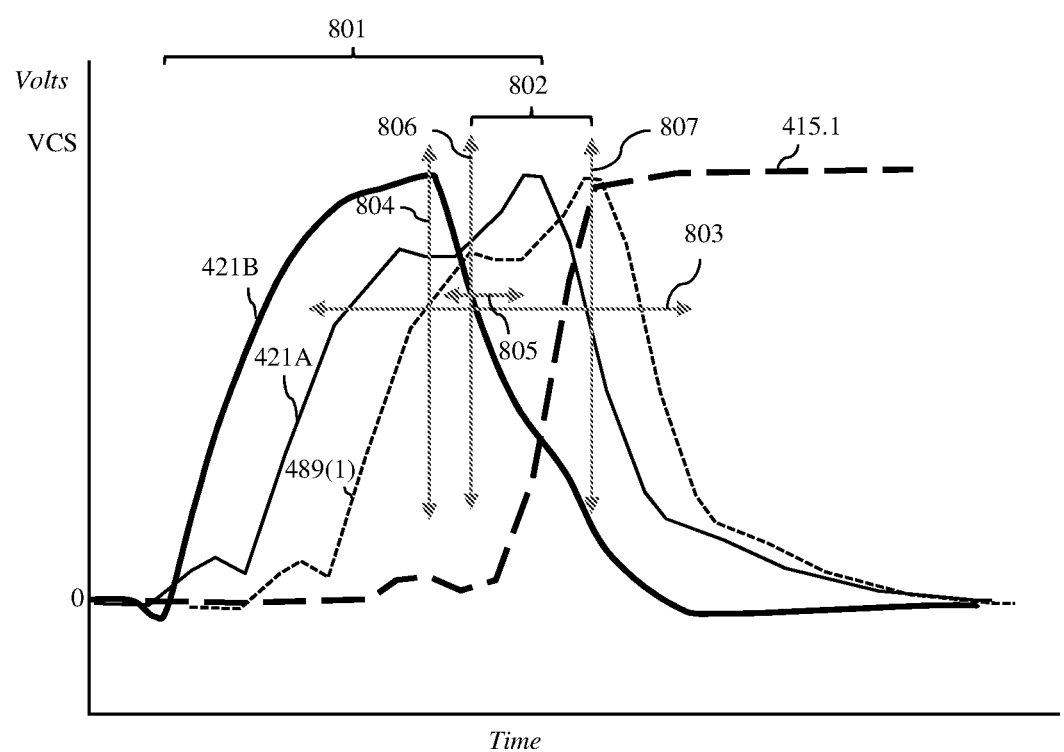
FIG. 8 is a graph illustrating voltage transitions on adjacent wordlines for a row and a storage node of a selected memory cell in the multi-port memory array of FIG. 4 when a port A write operation follows a port B read or other operation in the same access period and the voltage on the first wordline is boosted to mitigate wordline coupling.

FIG. 8 is an exemplary voltage diagram illustrating ideal voltage transitions in an exemplary multi-port memory cell (such as the 2P-SRAM cell shown in FIG. 6 or the DP-SRAM cell shown FIG. 7) where the first voltage on a first wordline 421A is boosted with the above-described first voltage boost circuit 480A of FIG. 4. Specifically, the voltage diagram illustrates voltage transitions of the first wordline voltage signal (which is captured from the first wordline 421A and input to the first NAND gate 483(1)), of the delayed first wordline voltage signal 489(1) (which is output by the first delay circuit 484(1) and input to first NAND gate 483(1)), of a second wordline voltage signal (which is captured from the second wordline 421B and which controls the gate of the PFET 481(1)), and of a data value stored in the first storage node 415.1 of a selected memory cell in a given row. These transitions are occurring in the same clock cycle, when a port A write operation (e.g., to switch the data value stored in the first storage node 415.1 from a "0" to a "1" in this example) is initiated immediately following initiation of a port B operation with respect to either the same selected memory or a different selected memory cell in the same row. When these two operations are initiated, the voltage on the first storage node 415.1 of the selected memory cell 401 being written to is low indicating that the current data value stored in that selected memory cell 401 is a "0". For the port B operation (e.g., a read operation), the second wordline 421B is activated. For the port A write operation, the first wordline 421A is activated some period of time following activation of the second wordline 421B.

As illustrated, due to the delayed activation of the first wordline 421A, the second wordline voltage signal on the second wordline 421B will reach the full VCS level and begin transitioning from high to low before the first wordline 421A reaches the full VCS level. To ensure that wordline coupling doesn't prevent the first wordline voltage signal on the first wordline 421A from reaching the full VCS level within the expected rise time 801 (e.g., when the second wordline voltage signal from the second wordline 421B begins transitioning from high to low and the first wordline voltage signal from the first wordline 421A is still transitioning from low to high), the first voltage boost circuit 480A boosts the first voltage on the first wordline 421A during a predetermined assist period 802, which is automatic as a function of the configuration of the first voltage boost circuit 480A and the internally generated signals used to control timing voltage of that circuit.

That is, as discussed above, the first voltage boost circuit 480A will boost the first voltage on the first wordline 421A only when PFETs 481(1) and 482(1) are both turned on. PFET 482(1) is turned on when both the delayed first wordline voltage signal 489(1) and the first wordline voltage signal captured from the first wordline 421A are above a first predetermined level 803. It should be noted that the first wordline voltage signal is delayed a specific amount of time in order to generate the delayed first wordline voltage signal 489(1). The specific time period is predetermined so that the output of the first NAND gate 483(1) maintains a high logic value until after the second input of NAND gate 483(1) reaches half the rise slope of the wordline 421A. The PFET 481(1) will turn on only when the second wordline voltage signal captured from the second wordline 421B is at or below a second predetermined level 805. Thus, timing of the first voltage boost circuit 480A is controlled by internally generated signals (i.e., the first wordline voltage signal, the second wordline voltage signal and the delayed first wordline voltage signal) and these signals ensure that the boosting of the first voltage on the first wordline 421A occurs only when needed and, particularly, only during the assist period 802, which begins at reference marker 806 when (a) both the inputs to the first NAND gate 483(1) are above the first predetermined level 803 (see reference marker 804) such that the PFET 482(1) turns on and (b) the second wordline voltage signal is below the second predetermined level 805, and which ends at reference marker 807 when the first wordline voltage signal falls below the first predetermined level 803 such that the output of the first NAND gate 483(1) goes high and the PFET 482(1) turns off.

In the multi-port memory array embodiment 400 of FIG. 4, the optional second voltage boost circuit 480B can be configured essentially the same as the first voltage boost circuit 480A but with the connections to the two wordlines 421A and 421B being swapped so that a voltage boost or assist is applied to the second wordline 421B as opposed to the first wordline 421A. Specifically, the second voltage boost circuit 480B can include two second p-type field effect transistors (PFETs) 481(2) and 482(2) electrically connected in series between the positive supply voltage (e.g., VCS) and a node on the second wordline 421B at or near the second distal end 426B. The second voltage boost circuit 480B can further include a second delay circuit 484(2) (e.g., a second buffer delay circuit) and a second NAND gate 483(2). As illustrated, the gate of the PFET 481(2) can be electrically connected to a node on the first wordline 421A at or near the first distal end 426A such that the on/off state of the PFET 481(2) is controlled by the first wordline voltage signal from the first wordline 421A. The gate of the PFET 482(2) can be electrically connected to the output of the second NAND gate 483(2) such that the on/off state of the PFET 482(2) is controlled by the logic value output from the second NAND gate 483(2). The second delay circuit 484(2) can be electrically connected in series between a node on the second wordline 421B at or near the second distal end 426B and an input to the second NAND gate 483(2). The other input to the second NAND gate 483(2) can be connected to a node on the second wordline 421B at or near the second distal end 426B. Those skilled in the art will recognize that operation of this second voltage boost circuit 480B will be analogous to operation of the first voltage boost circuit 480A described above. However, in this case, timing will be controlled based on internally generated signals including the first wordline voltage signal, the second wordline voltage signal, and the delayed second wordline signal 489(2).

Referring to the multi-port memory array embodiment 400' of FIG. 5, each first voltage boost circuit 480A' (which will provide a voltage boost or assist for the first wordline 421A of a given row) can include two first p-type field effect transistors (PFETs) 481(1) and 482(1) electrically connected in series between a positive supply voltage (e.g., VCS) and a node on the first wordline 421A at or near the first distal end 426A. The first voltage boost circuit 480A' can further include a first inverter 485(1) and a first NAND gate 483(1). As illustrated, the gate of the PFET 481(1) can be electrically connected to a node on the second wordline 421B at or near the second distal end 426B such that the on/off state of the PFET 481(1) is controlled by a second wordline voltage signal received from the second wordline 421B. The gate of the PFET 482(1) can be electrically connected to the output of the first NAND gate 483(1) such that the on/off state of the PFET 482(1) is controlled by a logic value output from the first NAND gate 483(1). The first inverter 485(1) can be electrically connected in series between a bitline pre-charge circuit of the bitline drivers 435B for the second port (i.e., port B) and an input to the first NAND gate 483(1). The other input to the first NAND gate 483(1) can be connected to a node on the first wordline 421A at or near the first distal end 426A.

With this configuration, the first voltage boost circuit 480A' will boost the first voltage on the first wordline 421A only when both of the PFETs 481(1) and 482(1) are turned on. In operation, the first inverter 485(1) can capture (i.e., receive) a second port bitline pre-charge signal 436B from the bitline pre-charge circuit of the bitlines drivers 435B, can invert that signal, and can output an inverted second port bitline pre-charge signal 488(1). The first NAND gate 483(1) can capture (i.e., receive) the inverted second port bitline pre-charge signal 488(1) from the first inverter 485(1) and the first wordline voltage signal from a node on the first wordline 421A at or near the first distal end 426A and can be configured to output a logic value according to a standard truth table for a NAND gate. That is, the first NAND gate 483(1) will output a high logic value unless both the inverted second port bitline pre-charge signal 488(1) and the first wordline voltage signal are above a first predetermined level (i.e., a threshold level at which the first NAND gate reads the signals as being high logic values or logic values of "1") at which point the first NAND gate 483(1) will output a low logic value (i.e., a logic value of "0"). Once the first NAND gate's output has a low logic value, the PFET 482(1) will turn on. The PFET 481(1) is turned on only when the second voltage on the second wordline 421B (i.e., the second wordline voltage signal) is below a second predetermined level (e.g., when the second wordline is either already low or transitioning from high to low).

Figure 9:
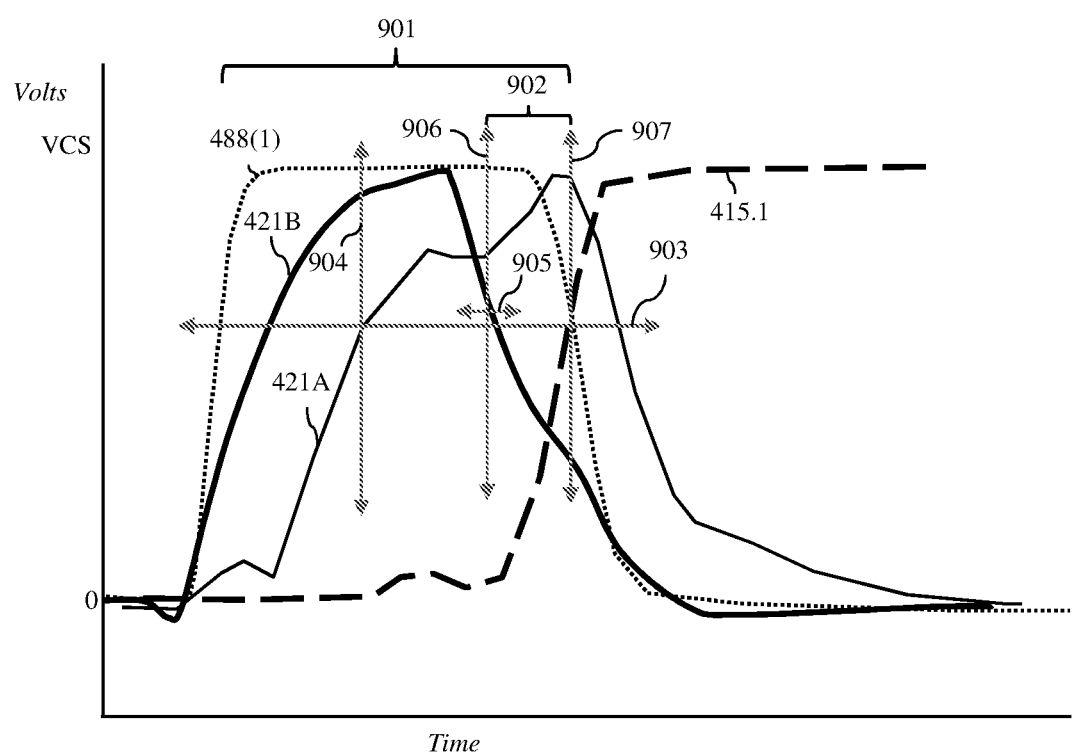
FIG. 9 is a graph illustrating voltage transitions on adjacent wordlines for a row and a storage node of a selected memory cell in the multi-port memory array of FIG. 5 when a port A write operation follows a port B read or other operation in the same access period and the voltage on the first wordline is boosted to mitigate wordline coupling.

FIG. 9 is an exemplary voltage diagram illustrating ideal voltage transitions in an exemplary multi-port memory cell (such as the 2P-SRAM cell shown in FIG. 6 or the DP-SRAM cell shown FIG. 7) where the first voltage on a first wordline 421A is boosted with the above-described first voltage boost circuit 480A' of FIG. 5. Specifically, the voltage diagram illustrates voltage transitions of the first wordline voltage signal (which is captured from the first wordline 421A and input to the first NAND gate 483(1)), of the inverted second port bitline pre-charge signal 488(1) (which is inverted relative to a second port bitline pre-charge signal 436B, output by the first inverter 485(1) and input to first NAND gate 483(1)), of a second wordline voltage signal (which is captured from the second wordline 421B and which controls the gate of the PFET 481(1)), and of a data value stored in the first storage node 415.1 of a selected memory cell in a given row. These transitions are occurring in the same clock cycle, when a port A write operation (e.g., to switch the data value stored in the first storage node 415.1 from a "0" to a "1" in this example) is initiated immediately following initiation of a port B operation with respect to either the same selected memory or a different selected memory cell in the same row. When these two operations are initiated, the voltage on the first storage node 415.1 of the selected memory cell 401 is low indicating that the current data value stored in that selected memory cell 401 is a "0". For the port B operation (e.g., a read operation), the second wordline 421B is activated. For the port A write operation, the first wordline 421A is activated some period of time following activation of the second wordline 421B.

As illustrated, due to the delayed activation of the first wordline 421A, the second wordline 421B will reach the full VCS level and begin transitioning from high to low before the first wordline 421A reaches the full VCS level. Furthermore, given conventional memory array operation, the inverted second port bitline pre-charge signal 488(1) will transition from low to high relatively quickly (i.e., prior to full activation of the second wordline 421B) and will remain high and, particularly, above a first predetermined level 903 for a period of time that is approximately equal to or slightly longer than the expected rise time 901 (i.e., expected time period for reaching the high voltage level) of the first wordline voltage signal from the first wordline 421A. Thus, as illustrated, completion of the low to high voltage transitions of the inverted second port bitline pre-charge signal 488(1), of the second wordline voltage signal from the second wordline 421B and of the first wordline voltage signal from the first wordline 421A occur in sequence. This sequence changes for initiation of the high to low voltage transitions. Specifically, the high to low voltage transitions of the second wordline voltage signal on the second wordline 421B, of the inverted second port bitline pre-charge signal 488(1), and of the first wordline voltage signal on the first wordline 421A are initiated in sequence with the high to low voltage transition of the inverted second port bitline pre-charge signal 488(1) being initiated between initiation of the high to low transition of the second wordline signal on the second wordline 421B and completion of the low to high voltage transition of the first wordline voltage signal on the first wordline 421A. To ensure that wordline coupling doesn't prevent the first wordline 421A from reaching the full VCS level within the expected rise time 901 (e.g., when the second wordline 421B begins transitioning from high to low and the first wordline 421A is still transitioning from low to high), the first voltage boost circuit 480A' boosts the first voltage on the first wordline 421A during a predetermined assist period 902, which is automatic as a function of the configuration of the first voltage boost circuit 480A' and the internally generated signals used to control timing voltage of that circuit.

That is, as discussed above, the first voltage boost circuit 480A' will boost the first voltage on the first wordline 421A only when PFETs 481(1) and 482(1) are both turned on. PFET 482(1) is turned on when both the inverted second port bitline pre-charge signal 488(1) and the first wordline voltage signal captured from the first wordline 421A are above the first predetermined level 903 (see reference marker 904). The PFET 481(1) will turn on only when the second wordline voltage signal captured from the second wordline 421B is at or below a second predetermined level 905. Thus, timing of the first voltage boost circuit 480A' is controlled by internally generated signals (including the first wordline voltage signal, the second wordline voltage signal and a bitline pre-charge signal 436B for the second port, which is subsequently inverted into the inverted second port bitline pre-charge signal 488(1) by the first inverter 485(1)) and these signals ensure that the boosting of the first voltage on the first wordline 421A occurs when needed and, particularly, only during the assist period 902, which begins at reference marker 906 when (a) both the inputs to the first NAND gate 483(1) are above the first predetermined level 903 (see reference marker 904) such that the PFET 482(1) turns on and (b) the second wordline voltage signal is below the second predetermined level 905, and which ends at reference marker 907 when the inverted second port bitline pre-charge signal 488(1) falls below the first predetermined level 903 such that the output of the first NAND gate 483(1) goes high and the PFET 482(1) turns off. As illustrated, the inverted second port bitline pre-charge signal 488(1) falls below the first predetermined level 903 some time at or after the expected rise time 901 when the first voltage on the first wordline 421A should have reached the full VCS level and no longer requires boosting.

In the multi-port memory array embodiment 400' of FIG. 5, the optional second voltage boost circuit 480B' can be configured essentially the same as the first voltage boost circuit 480A' but with the connections to the two wordlines 421A and 421B being swapped and a connection to a port A bitline pre-charge circuit (as to opposed to a port B bitline pre-charge circuit) so that a voltage boost or assist is applied to the second wordline 421B as opposed to the first wordline 421A. Specifically, each second voltage boost circuit 480B' (which will provide a voltage boost or assist for the second wordline 421B of a given row) can include two first p-type field effect transistors (PFETs) 481(2) and 482(2) electrically connected in series between the positive supply voltage (e.g., VCS) and a node on the second wordline 421B at or near the second distal end 426B. The second voltage boost circuit 480B' can further include a second inverter 485(2) and a second NAND gate 483(2). As illustrated, the gate of the PFET 482(2) can be electrically connected to a node on the first wordline 421A at or near the first distal end 426A such that the on/off state of the PFET 481(2) is controlled by a first wordline voltage signal received from the first wordline 421A. The gate of the PFET 482(2) can be electrically connected to the output of the second NAND gate 483(2) such that the on/off state of the PFET 482(2) is controlled by a logic value output from the second NAND gate 483(2). The second inverter 485(2) can be electrically connected in series between a bitline pre-charge circuit of the bitline drivers 435A for the first port (i.e., port A) and an input to the second NAND gate 483(2). The other input to the second NAND gate 483(2) can be connected to a node on the second wordline 421A at or near the first distal end 426A. Those skilled in the art will recognize that operation of this second voltage boost circuit 480B' will be analogous to operation of the first voltage boost circuit 480A' described above. However, in this case, timing will be controlled based on internally generated signals including the first wordline voltage signal, the second wordline voltage signal, and a bitline pre-charge signal 436A for the first port (i.e., port A), which is subsequently inverted by the second inverter 485(2) into an inverted pre-charge signal 488(2).

Figure 10:
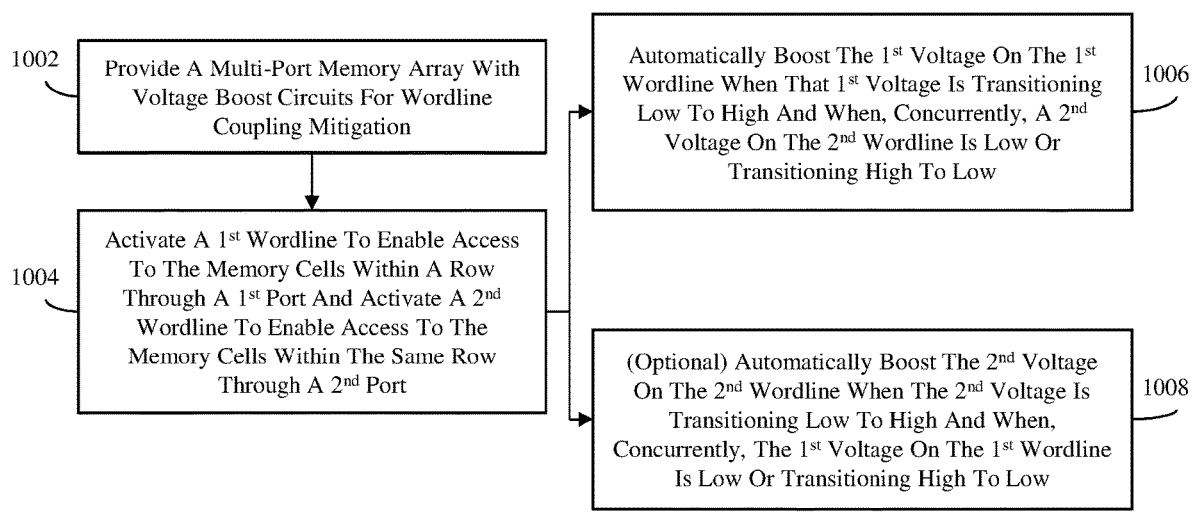
FIG. 10 is a flow diagram illustrating a method of operating a multi-port memory array with voltage boost circuits.

Referring to the flow diagram of FIG. 10, also disclosed herein is a method of operating a multi-port memory array (e.g., a two port-static random access memory (2P-SRAM) array or a dual port-static random access memory (DP-SRAM) array). The method embodiments employ voltage boost circuits to automatically boost the voltage on wordlines to minimize resistance-capacitance (RC) delay caused by coupling between adjacent wordlines when certain conditions are met.

Specifically, the method embodiments can include providing a multi-port memory array, such as any one of the multi-port memory array embodiments 400 and 400' of FIGS. 4 and 5, respectively, which are discussed in detail above and which include multi-port memory cells 401 arranged in columns and rows (see process step 1002). The method embodiments can further include accessing selected memory cells within the multi-port memory array through two different ports (see process step 1004). During this process, a first wordline connected to each of the memory cells in a given row can be activated to enable access to the memory cells in that row through a first port (e.g., port A) and, during the same clock cycle, a second wordline connected to each of the memory cells in the same row can be activated to enable access to the memory cells through a second port (i.e., port B). For example, during process step 1004, a first wordline 421A connected to each of the memory cells 401 in a given row can be activated to enable access to a selected memory cell within the row through a first port (e.g., port A) and, during the same clock cycle (i.e., the same access period), a second wordline 421B connected to each of the memory cells 401 in the same row can be activated to enable access to either the same selected memory cell or a different selected memory cell in the same row through a second port (i.e., port B).

Furthermore, depending upon the specific voltage states of the first wordline 421A and the second wordline 421B and, thereby potential wordline coupling, during a given clock cycle, the voltage on either the first wordline 421A or the second wordline 421B can be boosted to ensure full wordline activation and avoid errors. That is, the method embodiments can further include boosting a first voltage on the first wordline 421A during a given access period specifically under the following conditions: when the first voltage is transitioning from a low voltage level toward a high voltage level and when, concurrently, a second voltage on the second wordline 421B is either at the low voltage level or transitioning from the high voltage level to the voltage level (see process step 1006). For example, in a 2P-SRAM array or a DP-SRAM array, the first voltage on a first wordline 421A for a given row can be boosted when the first wordline 421A is transitioning low to high in order to perform a port A write operation to switch the data value stored in a selected memory cell within that row and when, concurrently, the second voltage on the second wordline 421B is either already low or transitioning from high to low performance of a port B read operation. In the case of a DP-SRAM array, the first voltage on the first wordline 421A for a given row can also be boosted under these same conditions (i.e., during low to high voltage transition of the first wordline when the voltage on the second wordline is low or transitioning high to low) regardless of the types of operations (read or write) being performed on the same selected memory cell or different selected memory cells in the same row during the same access period. Boosting the first voltage can be performed automatically by a first voltage boost circuit (e.g., see the first voltage boost circuit 480A of FIG. 4 or 480A' of FIG. 5), which is connected to both the first wordline 421A and the second wordline 421B.

The method embodiments can also, optionally, include boosting a second voltage on the second wordline 421B during a different access period specifically under the following conditions: when the second voltage is transitioning from the low voltage level toward the high voltage level and when, concurrently, the first voltage on the first wordline 421A is either at the low voltage level or transitioning from the high voltage level to the voltage level (see process step 1008). Boosting the second voltage can be performed automatically by a second voltage boost circuit (e.g., see the second voltage boost circuit 480B of FIG. 4 or 480B' of FIG. 5), which is also connected to both the first wordline 421A and the second wordline 421B.

It should be noted that, while errors due to wordline coupling can occur during both write operations and read operations, such errors are most prevalent during write operations when changing the stored data value from a "0" to a "1" or from a "1" to a "0". Thus, in a DP-SRAM array, where both port A and port B can be used to perform write and read operations, ideally both of the above-mentioned voltage boosting process steps 1006 and 1008 would be performed. However, in a 2P-SRAM array, where port A is used exclusively for performing write operations and port B is used exclusively for performing read operations, either both of the above-mentioned voltage boosting process steps 1006 and 1008 would be performed or only the voltage boosting process step 1006 would be performed to assist port A write operations (i.e., to boost a first voltage on the first wordlines 421A during a port A write operation when the first wordline is transitioning low to high and when, concurrently, the second wordline is transitioning from high to low following a port B read operation). By employing the voltage boosting process step 1006 to assist with only the port A write operations, the number of voltage boost circuits is reduced, thereby reducing chip area consumption and circuit complexity.

As discussed above with regard to the structure embodiments, the negative impact of wordline coupling (i.e., resistance-capacitance (RC) delay caused by wordline coupling) is negligible at the proximal ends of the wordlines near the wordline drivers and worsens as the distance from the wordline drivers increases (i.e., at the distal ends). Thus, in the method embodiments, the above-described voltage boosting process step 1006 and optional process step 1008 can be performed at or near the distal ends of the wordlines farthest from the wordline drivers. Specifically, in each row, the first wordline 421A has a first proximal end 425A adjacent to the wordline drivers 445A and a first distal end 426A opposite the first proximal end 425A and, similarly, the second wordline 421B has a second proximal end 425B adjacent to the wordline drivers 445B and a second distal end 426B opposite the second proximal end 425B. The first voltage boost circuit 480A, 480A' and, if included, the second voltage boost circuit 480B, 480B' can be electrically connected to the first wordline 421A at or near the first distal end 426A and to the second wordline 421B at or near the second distal end 426B so that the voltage boosts occur at or near the distal ends of the wordlines.

The method embodiments can further include controlling the timing of the above-described voltage boosting process steps 1006 (and, if applicable, 1008) using signals that are internally generated within the multi-port memory array embodiments 400, 400'. For example, in one embodiment of the method the timing of process step 1006, during which the first voltage on the first wordline 421A is boosted during a port A operation, can be controlled based on a first wordline voltage signal captured from a node on the first wordline 421A at or near the first distal end 426A, a second wordline voltage signal captured from a node on the second wordline 421B at or near the second distal end 426B, and a delayed first wordline voltage signal 489(1) output by the first delay circuit 484(1) (see the first voltage boost circuit 480A of FIG. 4 and the detailed description above). Additionally, in this embodiment of the method the timing of the optional process step 1008, during which the second voltage on the second wordline 421B is boosted during a port B operation, can be controlled based on the first wordline voltage signal, the second wordline voltage signal, and a delayed second wordline voltage signal 489(2) output by the second delay circuit 484(2) (see the second voltage boost circuit 480B of FIG. 4 and the detailed description above).

Alternatively, in another embodiment of the method the timing of process step 1006, during which the first voltage on the first wordline 421A is boosted during a port A operation, can be automatically controlled based on the first wordline voltage signal, the second wordline voltage signal, and a bitline pre-charge signal 436B for the second port (i.e., for port B), which is inverted by the first inverter 485(1) (see the inverted second port bitline pre-charge signal 488(1) and the first voltage boost circuit 480A' of FIG. 5 and the detailed description above). Additionally, in this same embodiment of the method the timing of the optional process step 1008, during which the second voltage on the second wordline 421B is boosted during a port B operation, can be automatically controlled based on the first wordline voltage signal, the second wordline voltage signal, and a bitline pre-charge signal 436A for the first port (i.e., port A), which is inverted by the second inverter 485(2) (see the inverted first port bitline pre-charge signal 488(2) and the second voltage boost circuit 480B' of FIG. 5 and the detailed description above). Thus, the disclosed method embodiments provide an integrated self-assist wordline coupling mitigation solution.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A multi-port memory array comprising:
    a row of memory cells;
    a first wordline connected to each of the memory cells in the row;
    a second wordline connected to each of the memory cells in the row; and
    a first voltage boost circuit connected to the first wordline and the second wordline, wherein the first voltage boost circuit boosts a first voltage on the first wordline during an access period when (i) the first voltage is transitioning from a low voltage level toward a high voltage level, and (ii) a second voltage on the second wordline is transitioning from the high voltage level to the low voltage level.

2. The multi-port memory array of claim 1, further comprising wordline drivers, wherein:
    the first wordline has (i) a first proximal end adjacent to the wordline drivers, and (ii) a first distal end opposite the first proximal end;
    the second wordline has (i) a second proximal end adjacent to the wordline drivers, and (ii) a second distal end opposite the second proximal end; and
    the first voltage boost circuit is connected to (i) the first wordline adjacent to the first distal end, and (ii) the second wordline adjacent to the second distal end.

3. The multi-port memory array of claim 2, wherein:
    the first voltage boost circuit comprises
        two p-type field effect transistors connected in series between a positive supply voltage and the first wordline adjacent to the first distal end,
        a delay circuit, and
        a NAND gate;
    gates of the two p-type field effect transistors are connected to the second wordline adjacent to the second distal end and to an output of the NAND gate, respectively;
    the delay circuit is connected between the first wordline adjacent to the first distal end and an input to the NAND gate; and
    another input to the NAND gate is connected to the first wordline adjacent to the first distal end.

4. The multi-port memory array of claim 3, wherein:
    the delay circuit captures a first wordline voltage signal from the first wordline, delays the first wordline voltage signal for a specific time period, and outputs a delayed first wordline voltage signal;

the first voltage boost circuit boosts the first voltage on the first wordline only when the two p-type field effect transistors are both turned on;

the NAND gate (i) receives the delayed first wordline voltage signal and the first wordline voltage signal, and (ii) outputs a low logic value to turn one of the two p-type field effect transistors only when both the delayed first wordline voltage signal and the first wordline voltage signal are above a first predetermined level;

another of the two p-type field effect transistors is turned on only when a second wordline voltage signal from the second wordline is below a second predetermined level; and the specific time period is predetermined to ensure that boosting of the first voltage occurs only after the second wordline voltage signal begins a high to low transition.

5. The multi-port memory array of claim 2, wherein:
the first wordline enables access to the memory cells in the row through a first port;
the second wordline enables access to the memory cells in the row through a second port;
the first voltage boost circuit comprises
    two p-type field effect transistors connected in series between a positive supply voltage and the first wordline adjacent to the first distal end,
    an inverter, and
    a NAND gate;
gates of the two p-type field effect transistors are connected to the second wordline adjacent to the second distal end and to an output of the NAND gate, respectively;
the inverter is connected in series between a bitline pre-charge circuit for the second port and an input to the NAND gate; and
another input to the NAND gate is connected to the first wordline adjacent to the first distal end.

6. The multi-port memory array of claim 5, wherein:
the inverter inverts a second port bitline pre-charge signal and outputs an inverted second port bitline pre-charge signal;
low to high voltage transitions of the inverted second port bitline pre-charge signal, a second wordline voltage signal from the second wordline and a first wordline voltage signal from the first wordline are completed in sequence;
high to low voltage transitions of the second wordline voltage signal, the inverted second port bitline pre-charge signal, and the first wordline voltage signal are initiated in sequence;
the first voltage boost circuit boosts the first voltage on the first wordline only when the two p-type field effect transistors are both turned on;
the NAND gate (i) receives the inverted second port bitline pre-charge signal and the first wordline voltage signal, and (ii) outputs a low logic value to turn on one of the two p-type field effect transistors only when both the inverted second port bitline pre-charge signal and the first wordline voltage signal are above a first predetermined level; and
another of the two p-type field effect transistors is turned on when the second wordline voltage signal is below a second predetermined level.

7. The multi-port memory array of claim 1, wherein the multi-port memory array comprises any of a two-port static random access memory array and a dual-port static random access memory array.

8. The multi-port memory array of claim 1, further comprising a second voltage boost circuit connected to the first wordline and the second wordline, wherein the second voltage boost circuit boosts the second voltage on the second wordline during a different access period when the second voltage is transitioning from the low voltage level toward the high voltage level and the first voltage on the first wordline is either at the low voltage level or transitioning from the high voltage level to the low voltage level.

9. The multi-port memory array of claim 8, further comprising wordline drivers, wherein:
the first wordline has (i) a first proximal end adjacent to the wordline drivers, and (ii) a first distal end opposite the first proximal end;
the second wordline has (i) a second proximal end adjacent to the wordline drivers, and (ii) a second distal end opposite the second proximal end; and
the first voltage boost circuit and the second voltage boost circuit are each connected to the first wordline adjacent to the first distal end and to the second wordline adjacent to the second distal end.

10. The multi-port memory array of claim 9, wherein:
the first voltage boost circuit comprises
    two first p-type field effect transistors connected in series between a positive supply voltage and the first wordline adjacent to the first distal end,
    a first delay circuit, and
    a first NAND gate, wherein gates of the first p-type field effect transistors are connected to the second wordline adjacent to the second distal end and to an output of the first NAND gate, respectively,
    wherein the first delay circuit is connected between the first wordline adjacent to the first distal end and an input to the first NAND gate, and
    wherein another input to the first NAND gate is connected to the first wordline adjacent to the first distal end; and
the second voltage boost circuit comprises
    two second p-type field effect transistors connected in series between the positive supply voltage and the second wordline adjacent to the second distal end,
    a second delay circuit, and
    a second NAND gate, wherein gates of the second p-type field effect transistors are connected to the first wordline adjacent to the first distal end and to an output of the second NAND gate, respectively,
    wherein the second delay circuit is connected between the second wordline adjacent to the second distal end and an input to the second NAND gate, and
    wherein another input to the second NAND gate is connected to the second wordline adjacent to the second distal end.

11. The multi-port memory array of claim 10, wherein:
the first delay circuit captures a first wordline voltage signal from the first wordline, delays the first wordline voltage signal for a specific time period, and outputs a delayed first wordline voltage signal;
the first voltage boost circuit boosts the first voltage on the first wordline only when the two first p-type field effect transistors are both turned on;
the first NAND gate (i) receives the delayed first wordline voltage signal and the first wordline voltage signal, and (ii) outputs a low logic value to turn one of the first p-type field effect transistors only when both the delayed first wordline voltage signal and the first wordline voltage signal are above a first predetermined level;

another of the first p-type field effect transistors is turned on only when a second wordline voltage signal from the second wordline is below a second predetermined level; and the specific time period is predetermined to ensure that boosting of the first voltage occurs only after the second wordline voltage signal begins a high to low transition.

12. The multi-port memory array of claim 9, wherein:

the first wordline enables access to the memory cells in the row through a first port and the second wordline enables access to the memory cells in the row through a second port; and the first voltage boost circuit comprises
  two first p-type field effect transistors connected in series between a positive supply voltage and the first wordline adjacent to the first distal end,
  a first inverter, and
  a first NAND gate, wherein gates of the two first p-type field effect transistors are connected to the second wordline adjacent to the second distal end and to an output of the first NAND gate, respectively,
  wherein the first inverter is connected between a bitline pre-charge circuit for the second port and an input to the first NAND gate, and
  wherein another input to the first NAND gate is connected to the first wordline adjacent to the first distal end, and the second voltage boost circuit comprises
  two second p-type field effect transistors connected in series between the positive supply voltage and the second wordline adjacent to the second distal end,
  a second inverter, and
  a second NAND gate, wherein gates of the two second p-type field effect transistors are connected to the first wordline adjacent to the first distal end and to an output of the second NAND gate, respectively,
  wherein the second inverter is connected between a bitline pre-charge circuit for the first port and an input to the second NAND gate, and
  wherein another input to the second NAND gate is connected to the second wordline adjacent to the second distal end.

13. The multi-port memory array of claim 12, wherein:

the first inverter inverts a second port bitline pre-charge signal and outputs an inverted second port bitline pre-charge signal;

low to high voltage transitions of the inverted second port bitline pre-charge signal, a second wordline voltage signal from the second wordline and a first wordline voltage signal from the first wordline are completed in sequence;

high to low voltage transitions of the second wordline voltage signal, the inverted second port bitline pre-charge signal, and the first wordline voltage signal are initiated in sequence;

the first voltage boost circuit boosts the first voltage on the first wordline only when the first p-type field effect transistors are both turned on;

the first NAND gate receives the inverted second port bitline pre-charge signal and the first wordline voltage signal and outputs a low logic value to turn on one of the first p-type field effect transistors only when both the inverted second port bitline pre-charge signal and the first wordline voltage signal are above a first predetermined level; and another of the first p-type field effect transistors is turned on when the second wordline voltage signal is below a second predetermined level.

14. The multi-port memory array of claim 8, wherein the multi-port memory array comprises either a two-port static random access memory array or a dual-port static random access memory array.

15. A method comprising:

accessing memory cells in a row of memory cells in a multi-port memory array, wherein, during the accessing, a first wordline connected to each of the memory cells in the row enables access through a first port and a second wordline connected to each of the memory cells in the row enables access through a second port; and boosting a first voltage on the first wordline during an access period when the first voltage is transitioning from a low voltage level toward a high voltage level and a second voltage on the second wordline is transitioning from the high voltage level to the low voltage level, wherein the boosting of the first voltage is performed by a first voltage boost circuit.

16. The method of claim 15, wherein:

the first wordline has a first proximal end adjacent to wordline drivers and a first distal end opposite the first proximal end;

the second wordline has a second proximal end adjacent to the wordline drivers and a second distal end opposite the second proximal end; and the boosting of the first voltage is performed by the first voltage boost circuit adjacent to the first distal end of the first wordline to mitigate resistive-capacitive delay caused by wordline coupling.

17. The method of claim 15, further comprising controlling timing of the boosting of the first voltage based on signals internally generated within the multi-port memory array.

18. The method of claim 17, wherein the signals comprise a first wordline voltage signal from the first wordline, a second wordline voltage signal from the second wordline, and either a delayed first wordline voltage signal output by a delay circuit or an inverted second port bitline pre-charge signal output by an inverter.

19. The method of claim 15, wherein the multi-port memory array comprises either a two-port static random access memory array or a dual-port static random access memory array.

20. The method of claim 15, further comprising boosting the second voltage on the second wordline during a different access period when the second voltage on the second wordline is transitioning from the low voltage level toward the high voltage level and the first voltage on the first wordline is either at the low voltage level or transitioning from the high voltage level to the low voltage level, wherein the boosting of the second voltage is performed by a second voltage boost circuit.

21. A multi-port memory array comprising: a row of memory cells;

a first wordline connected to each of the memory cells in the row;

a second wordline connected to each of the memory cells in the row; and a first voltage boost circuit connected to the first wordline and the second wordline, wherein the first voltage boost circuit boosts a first voltage on the first wordline during an access period when the first voltage is transitioning from a low voltage level toward a high voltage level and a second voltage on the second wordline is either at the low voltage level or transitioning from the high voltage level to the low voltage level, wherein the first voltage boost circuit comprises two p-type field effect transistors connected in series between a positive supply voltage and the first wordline, a delay circuit, and a NAND gate, gates of the two p-type field effect transistors are connected to the second wordline and to an output of the NAND gate, respectively, the delay circuit is connected between the first wordline and an input to the NAND gate, and another input to the NAND gate is connected to the first wordline.

22. A multi-port memory array comprising: a row of memory cells;

a first wordline connected to each of the memory cells in the row;

a second wordline connected to each of the memory cells in the row; and a first voltage boost circuit connected to the first wordline and the second wordline, wherein the first voltage boost circuit boosts a first voltage on the first wordline during an access period when the first voltage is transitioning from a low voltage level toward a high voltage level and a second voltage on the second wordline is either at the low voltage level or transitioning from the high voltage level to the low voltage level, wherein the first wordline enables access to the memory cells in the row through a first port, the second wordline enables access to the memory cells in the row through a second port, the first voltage boost circuit comprises two p-type field effect transistors connected in series between a positive supply voltage and the first wordline, an inverter, and a NAND gate, gates of the two p-type field effect transistors are connected to the second wordline and to an output of the NAND gate, respectively, the inverter is connected in series between a bitline pre-charge circuit for the second port and an input to the NAND gate, and another input to the NAND gate is connected to the first wordline.

23. A method comprising:

accessing memory cells in a row of memory cells in a multi-port memory array, wherein, during the accessing, a first wordline connected to each of the memory cells in the row enables access through a first port and a second wordline connected to each of the memory cells in the row enables access through a second port;

boosting a first voltage on the first wordline during an access period when the first voltage is transitioning from a low voltage level toward a high voltage level and a second voltage on the second wordline is either at the low voltage level or transitioning from the high voltage level to the low voltage level, wherein the boosting of the first voltage is performed by a first voltage boost circuit; and controlling timing of the boosting of the first voltage based on signals internally generated within the multi-port memory array, wherein the signals comprise a first wordline voltage signal from the first wordline, a second wordline voltage signal from the second wordline, and either a delayed first wordline voltage signal output by a delay circuit or an inverted second port bitline pre-charge signal output by an inverter.

* * * * *